(12) United States Patent
Wilson

(10) Patent No.: US 11,579,990 B2
(45) Date of Patent: Feb. 14, 2023

(54) INTELLIGENT POST-PACKAGING REPAIR

(71) Applicant: Micron Technology, Inc., Boise, ID (US)

(72) Inventor: Alan J. Wilson, Boise, ID (US)

(73) Assignee: Micron Technology, Inc., Boise, ID (US)

(*) Notice: Subject to any disclaimer, the term of this patent is extended or adjusted under 35 U.S.C. 154(b) by 48 days.

(21) Appl. No.: 17/142,828

(22) Filed: Jan. 6, 2021

(65) Prior Publication Data

US 2021/0124660 A1 Apr. 29, 2021

Related U.S. Application Data

(63) Continuation of application No. 16/161,932, filed on Oct. 16, 2018, now Pat. No. 10,909,011.

(51) Int. Cl.

| | |
|---|---|
| *G06F 11/20* | (2006.01) |
| *G11C 17/16* | (2006.01) |
| *G11C 17/18* | (2006.01) |
| *G06F 11/10* | (2006.01) |
| *G06F 3/06* | (2006.01) |
| *G06F 12/02* | (2006.01) |
| *G06F 11/16* | (2006.01) |

(52) U.S. Cl.
CPC ........ *G06F 11/2094* (2013.01); *G06F 3/0619* (2013.01); *G06F 3/0655* (2013.01); *G06F 3/0679* (2013.01); *G06F 11/1008* (2013.01); *G06F 11/1666* (2013.01); *G06F 12/0207* (2013.01); *G11C 17/16* (2013.01); *G11C 17/18* (2013.01); *G06F 2201/85* (2013.01)

(58) Field of Classification Search
CPC ... G06F 11/1666; G06F 11/20; G06F 11/2094
USPC .................. 714/6.1, 6.11, 6.13, 6.2, 6.21
See application file for complete search history.

(56) References Cited

U.S. PATENT DOCUMENTS

| | | | |
|---|---|---|---|
| 9,349,491 B1 | 5/2016 | Morgan et al. | |
| 9,666,307 B1 | 5/2017 | Fujiwarai et al. | |
| 2011/0194367 A1 | 8/2011 | Wong et al. | |
| 2013/0210170 A1 | 8/2013 | Chou et al. | |
| 2014/0247677 A1 | 9/2014 | Sohn et al. | |
| 2015/0135038 A1 | 5/2015 | Wilson et al. | |
| 2015/0187436 A1 | 7/2015 | Querbach et al. | |
| 2016/0307647 A1* | 10/2016 | Morgan | G11C 17/16 |
| 2018/0075920 A1* | 3/2018 | Fujiwara | G11C 17/18 |
| 2018/0108413 A1 | 4/2018 | La Rosa et al. | |

* cited by examiner

*Primary Examiner* — Chae M Ko
(74) *Attorney, Agent, or Firm* — Holland & Hart LLP

(57) ABSTRACT

Techniques are provided for storing a row address of a defective row of memory cells to a bank of non-volatile storage elements (e.g., fuses or anti-fuses). After a memory device has been packaged, one or more rows of memory cells may become defective. In order to repair (e.g., replace) the rows, a post-package repair (PPR) operation may occur to replace the defective row with a redundant row of the memory array. To replace the defective row with a redundant row, an address of the defective row may be stored (e.g., mapped) to an available bank of non-volatile storage elements that is associated with a redundant row. Based on the bank of non-volatile storage elements the address of the defective row, subsequent access operations may utilize the redundant row and not the defective row.

20 Claims, 10 Drawing Sheets

INTELLIGENT POST-PACKAGING REPAIR

CROSS REFERENCE

The present Application for Patent is a continuation of U.S. patent application Ser. No. 16/161,932, by Wilson et al., entitled "INTELLIGENT POST-PACKAGING REPAIR," filed Oct. 16, 2018, assigned to the assignee hereof, and is expressly incorporated by reference in its entirety herein.

BACKGROUND

The following relates generally to a system that includes at least one memory device and more specifically to intelligent post-packing repair (PPR).

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source.

Improving memory devices, generally, may include increasing memory cell density, increasing read/write speeds, increasing reliability, increasing data retention, reducing power consumption, or reducing manufacturing costs, among other metrics. For example, some memory devices (e.g., some memory cells of memory devices) may develop defects after being packaged, and improved systems and techniques for post-packaging repair (PPR) may be desired.

DETAILED DESCRIPTION

Figure 1:
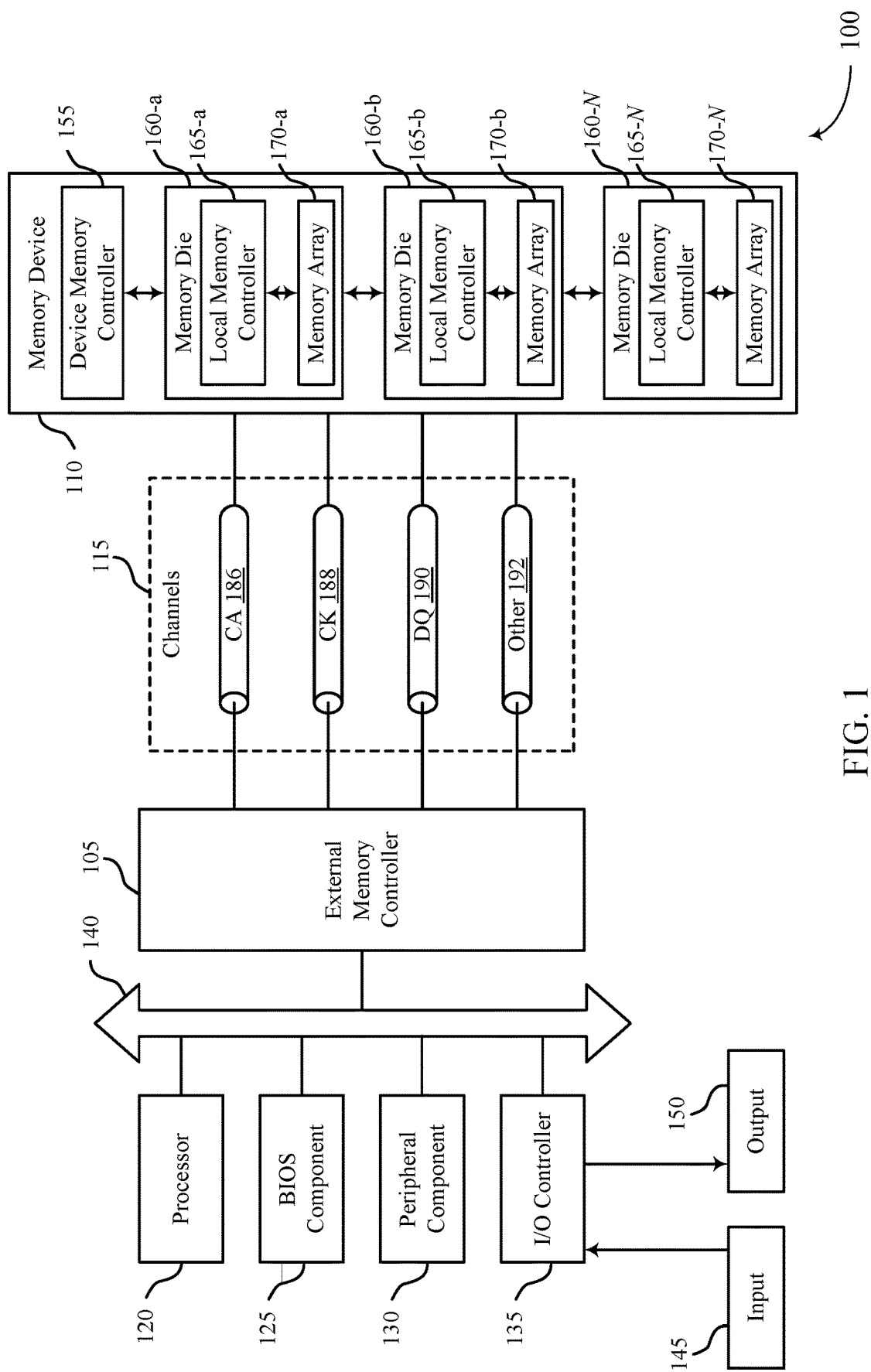
FIG. 1 illustrates an example of a system for storing a row address in a non-volatile storage element that supports intelligent post-packaging repair in accordance with aspects of the present disclosure.

Memory devices may have or develop defects (e.g., defective memory cells) after undergoing silicon die fabrication, but before placement of a respective memory die into a chip package. Before placement into a chip package, defects may be repaired via a pre-packaging repair process. In a pre-packaging repair process, memory cells configured to repair (e.g., "replace") a defective row (e.g., a prime data row) of memory cells may be used. These replacement rows may be referred to as "redundant rows." During a pre-packaging repair process, a defective row of memory cells may be "disabled" and a corresponding redundant row may be "enabled" in order to repair the defective memory cell(s).

In some instances, memory devices may also develop defects after placement of a memory die into a chip package. After the memory device has been packaged it may be accessible only through nodes (e.g., pins) of the package. Thus defective memory cells may be repaired post-packaging by, for example, a customer while assembling a system or by a host (e.g., a memory controller external to the system) during operation of the memory device. This process may be referred to as post-packaging repair (PPR). Due to the limited number of ways in which a memory device may be repaired post-packaging, PPR is typically a more difficult operation to perform than pre-packing repair.

Some systems may provide for PPR by dedicating a small number (e.g., 2) of rows of memory cells that are configured to repair (e.g., "replace") a defective row of memory cells post-packaging. These replacement rows may be referred to as "redundant rows" or "redundant PPR rows." The number of redundant PPR rows may small compared to a number of rows dedicated for pre-packaging repair (e.g., 94 rows). The number of redundant PPR rows may be relatively small due to the circuitry needed to operate the rows. For example, the circuitry may be both space and power-consuming. However, a memory device having a small number of redundant PPR rows is limited in the amount of PPR operations that it can conduct. Thus, some systems may sacrifice space and power (e.g., in order to include a larger number of redundant PPR rows), or an amount of potential PPR operations (e.g., due to a smaller number of redundant PPR rows).

In accordance with the systems and techniques described herein, a memory device may support a greater number of PPR operations, while mitigating any impact on space and power consumption, by providing rows dedicated generally for repair (e.g., dedicated redundant (replacement) rows available for pre-packaging repair or PPR) and techniques for managing and utilizing such a flexible set of redundant memory cells. For example, a memory device may include an increased number of redundant PPR rows (e.g., 96) without sacrificing additional space and power-consumption of the memory device. In some cases, in order to increase the amount of redundant PPR rows of a memory device, rows previously dedicated for only pre-packaging repair may be utilized for both pre-packing repair and PPR.

For example, a memory device may include one or more non-volatile storage elements (e.g., fuses or anti-fuses). As used herein, non-volatile storage element may refer to a single non-volatile storage element (e.g., a single fuse or single anti-fuse), or may refer to a group (or bank, or set, or row) of non-volatile storage elements configured to be operated as a unit (e.g., a bank of fuses or a bank of anti-fuses). Each bank may include a set of individual non-volatile storage elements, and at least some banks may be flexibly available for repair operations, either for pre-packaging repair or PPR. Banks of non-volatile storage elements may in some cases be alternatively referred to as rows of non-volatile storage elements (regardless of whether physically arranged in a row). Each such bank of non-volatile storage elements may be associated with a redundant row, and an address associated with a defective row may be stored (e.g., mapped) to any such bank of non-volatile storage elements. In a subsequent access operation (e.g., after a defective address—that is, the address of a defective row—has been stored), if the replaced prime data row is addressed, the redundant row may instead be accessed based on the address of the replaced prime data row being stored by the associated bank of non-volatile storage elements. By utilizing a memory device's non-volatile storage elements and a set of flexible redundant rows as described herein, the memory device may support an increased number of PPR operations without sacrificing space and power otherwise useful for additional circuitry.

Although a memory device may include multiple banks of non-volatile storage elements, not every non-volatile storage element or bank thereof may be available for use in a PPR operation. As described herein, non-volatile storage elements may be associated with a variety of operations of a memory device. Thus it may be necessary to determine whether a particular bank of non-volatile storage elements is available for use. In some examples, a memory device may include a circuit (e.g., a fuse logic circuit) configured to determine the availability of one or more banks of non-volatile storage elements for use in a PPR operation. The circuit may, for example, employ one or more digital logic devices to evaluate one or more bits stored by a bank of non-volatile storage elements to determine the element's availability. If determined to be available, the bank of non-volatile storage elements may then receive (e.g., store) an address of a defective row during a PPR operation.

In some examples, one or more replacement rows of memory cells used for previous repair operations may themselves become defective. For example, during a first PPR operation, a bank of non-volatile storage elements may be determined as available and may be configured (e.g., fuses in the bank may be blown) to store a row address of the defective row. Thus, during subsequent access operations, the redundant row associated with the bank of non-volatile storage elements (e.g., the redundant row that the bank of non-volatile storage elements maps to) may be used. However, this redundant row itself may later become defective. Thus, in some examples, a circuit of the memory device (e.g., the aforementioned fuse logic circuit) may be configured to determine whether a bank of non-volatile storage elements has previously been configured to store the defective row address, which if true, means that the redundant row previously used to replace the initially defective prime row has now itself become defective. In such cases, the bank of non-volatile storage elements that was previously used to store the defective row address may be disabled, so as to prevent mapping to the associated and now-defective redundant row of memory cells, and the defective row address may be stored to a different (e.g., a new), and available bank of non-volatile storage elements.

In some examples, a PPR operation may be initiated by a device such as a host or a local memory controller. Initiating the PPR operation may indicate, to the memory device, that ordinary operations (e.g., ordinary access operations) are to temporarily cease in order for one or more defective memory cells (e.g., one or more defective rows of memory cells) to be repaired. When the PPR operation commences, a row address corresponding to a defective memory cell may be identified. As described above, a bank of non-volatile storage elements may be determined to be available and/or unused, and the identified row address corresponding to the defective memory cell may be stored to the bank of non-volatile storage elements. Because the bank of non-volatile storage elements may be associated with (e.g., map to) a redundant row of memory cells, the corresponding redundant row of memory cells may be utilized (e.g., instead of the defective row) in subsequent access operations.

Features of the disclosure are initially described in the context of a memory system. Features of the disclosure are described in the context of a memory die, a system that includes a memory device, a process flow diagram, and a timing diagram in accordance with aspects of the present disclosure. These and other features of the disclosure are further illustrated by and described with reference to apparatus diagrams, system diagrams, and flowcharts that relate to intelligent post-packaging repair.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, the host device may initiate a PPR operation. For example, the host device may determine that one or more memory cells (e.g., one or more rows of memory cells) of a memory array (e.g., of memory array 170-a) are defective. Accordingly, the host device may request that the memory device 110 commence a PPR operation. For example, the host device may transmit an "Enter PPR" command to the memory device 110, which may result in the memory device 110 ceasing ordinary operations (e.g., ordinary access operations). Additionally or alternatively, the host device may transmit an "ACT command" (e.g., an activate command) to the memory device, which may initiate the PPR operation as described herein.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 125 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component (s) 125 may be other components understood by those skilled in the art as peripherals.

The I/O controller 135 may manage data communication between the processor 120 and the peripheral component(s) 13, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, etc. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein. In some examples, the system 100 may include a host (not shown) coupled with the memory device 110. The memory device 110 may include one or more memory arrays that include a plurality of redundant rows (e.g., redundant rows 325-a, 325-b, and 325-c as describe with reference to FIG. 3) and a fuse bank coupled with the memory array (e.g., a fuse array 330 as described with reference to FIG. 3). In some examples, the memory device 110 may include a fuse logic circuit (e.g., a fuse logic circuit 345 as described with reference to FIG. 3) that is configured to carry out one or more aspects of a PPR operation as described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2. In some examples, the memory array 170 may include a plurality of redundant rows of memory cells (e.g., redundant rows 325-a, 325-b, and 325-c) configured for use in a PPR operation. The redundant rows may each correspond to a bank (row) of non-volatile storage elements (e.g., a fuse or anti-fuse bank), and the redundant rows may serve as "replacement" rows for a defective prime row (e.g., a defective row of memory array 170).

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any number of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the number of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

In some examples, the local memory controller 165 may facilitate a PPR operation. For example, the local memory controller 165 may receive a row address that corresponds to a defective row of memory cells (e.g., of memory array 170). In some examples, the row address may be received from a host device. The local memory controller 165 may then determine an availability of one or more rows of non-volatile storage elements and, based on a particular non-volatile storage element's availability, store the received row address in the row of non-volatile storage elements. Further, in some cases, a memory controller such as a local memory controller 165 or device memory controller 155 may perform one or more operations or functions otherwise ascribed herein to a fuse logic circuit 345 as described with reference to FIG. 3.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 192 may be x4 (e.g., including four signal paths), x8 (e.g., including eight signal paths), x16 (including sixteen signal paths), etc.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured oscillate between a high state and a low state and coordinate the actions of the external memory controller 105 and the memory device 110. In some cases, the clock signal may be a differential output (e.g., a CK t signal and a CK c signal) and the signal paths of the CK channels 188 may be configured accordingly. In some cases, the clock signal may be single ended. In some cases, the clock signal may be a 1.5 GHz signal. A CK channel 188 may include any number of signal paths. In some cases, the clock signal CK (e.g., a CK t signal and a CK c signal) may provide a timing reference for command and addressing operations for the memory device 110, or other system-wide operations for the memory device 110. The clock signal CK may therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any number of signal paths.

In some cases, the other channels 192 may include one or more write clock signal (WCK) channels. While the 'W' in WCK may nominally stand for "write," a write clock signal WCK (e.g., a WCK t signal and a WCK c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured coordinate an access operation (e.g., a write operation or read operation) of the external memory controller 105 and the memory device 110. In some cases, the write clock signal may be a differential output (e.g., a WCK t signal and a WCK c signal) and the signal paths of the WCK channels may be configured accordingly. A WCK channel may include any number of signal paths. The data clock signal WCK may be generated by a data clock, which may include one or more hardware components (e.g., oscillators, crystals, logic gates, transistors, or the like). In some cases, the other channels 192 may include one or more error detection code (EDC) channels. The EDC channels may be configured to communicate error detection signals, such as checksums, to improve system reliability. An EDC channel may include any number of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11).

Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
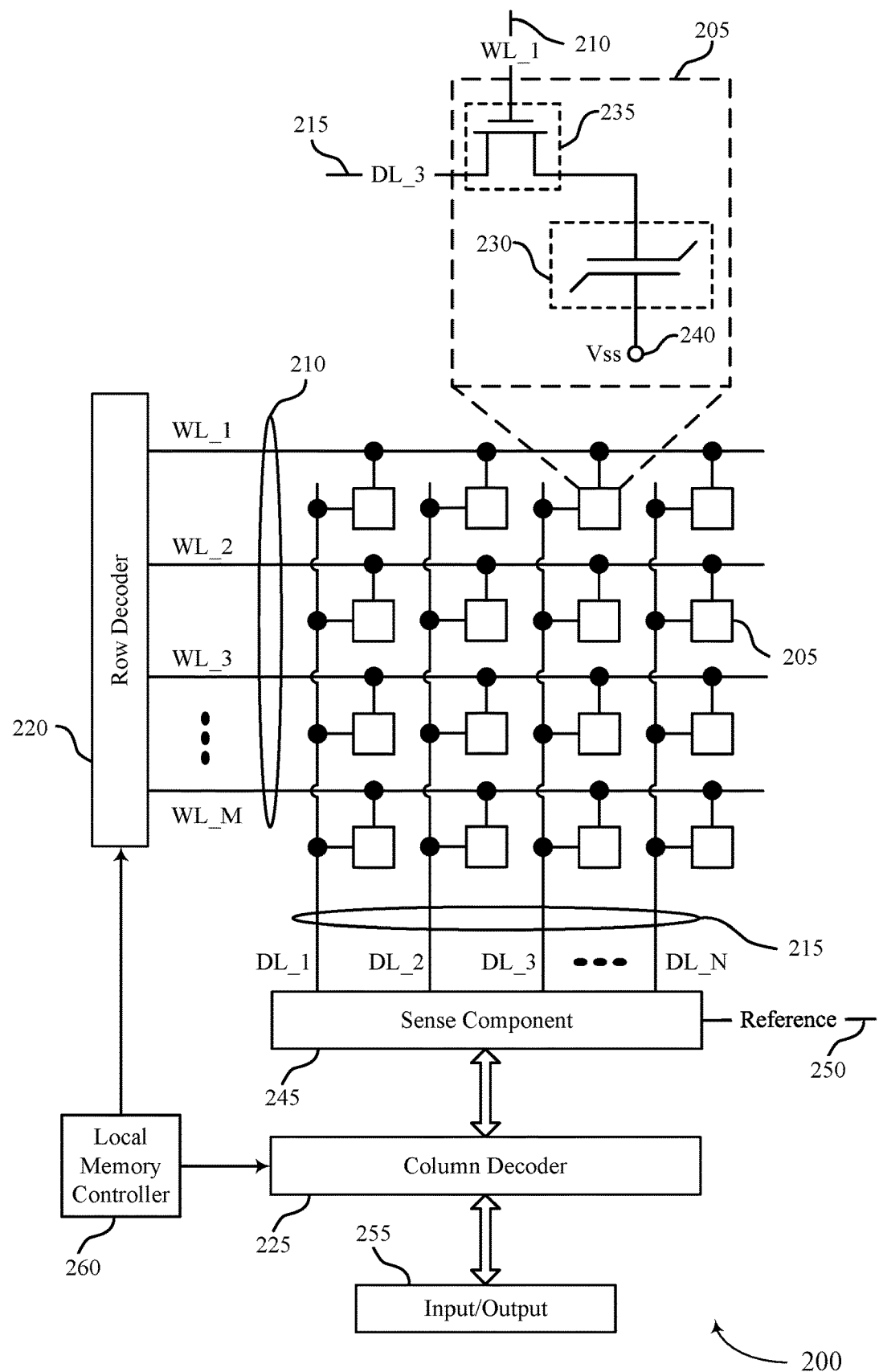
FIG. 2 illustrates an example of a memory die that supports intelligent post-packaging repair in accordance with aspects of the present disclosure.

FIG. 2 illustrates an example of a memory die 200 in accordance with various examples of the present disclosure. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In some examples, the memory cell 205 may be an example of a dynamic RAM (DRAM) memory cell, a synchronous dynamic RAM (SDRAM) memory cell, a ferroelectric RAM (FeRAM) memory cell, a magnetic RAM (MRAM) memory cell, a resistive RAM (RRAM) memory cell, flash memory, phase change memory (PCM), or another type of memory cell or memory device.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220, a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

In some examples, one or more memory cells (e.g., such as memory cell 205) may become defective during the course of operation. In order to repair the defective memory cell 205 (or the row that includes the defective memory cell 205), the address of the row may be identified. In some examples, the address of the row that includes the defective memory cell 205 may be identified by the local memory controller 260 and communicated to a host (e.g., external controller 105) or may be identified by the host (e.g., external controller 105). The row address of the defective row (row that includes the defective memory cell) may, in some examples, be stored to a bank (row) of non-volatile storage elements (e.g., fuses or anti-fuses) associated with a redundant row, so as to repair the row that includes the defective memory cell 205. By storing the row address associated with the defective memory cell 205 to the bank of non-volatile storage elements, subsequent access operations of the once-defective memory cell and the row that includes it may instead be conducted on the replacement redundant row of memory cells.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 is a ground such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some examples, the local memory controller 260 may facilitate a PPR operation as described herein. For example, the local memory controller 260 may receive a row address that corresponds to a defective row of memory cells (e.g., including memory cell 205). In some examples, the row address may be received from a host device (not shown). The local memory controller 260 may then determine an availability of one or more banks of non-volatile storage elements and, based on a particular bank's availability, store the received row address in the bank of non-volatile storage elements. In some examples, a read operation or a write operation described herein may be conducted on a redundant row of memory cells being associated with the bank of non-volatile storage elements that stored the received row address.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state. As described herein, a redundant row of memory cells may be utilized to repair (e.g., to "replace") a defective row of memory cells (e.g., a row that includes memory cell 205). By storing the address of the defective row of memory cells to a bank of non-volatile storage elements (e.g., a fuse or anti-fuse bank), an access operation may be conducted on a redundant row of memory cells associated with the bank of non-volatile storage elements, instead of on the defective row. Thus, in some examples, the write operation described herein may be conducted on a redundant row of memory cells (e.g., redundant row 1 325-a as described with reference to FIG. 3).

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation. As described herein, a redundant row of memory cells may be utilized to repair (e.g., to "replace") a defective row of memory cells (e.g., a row that includes memory cell 205). By storing the address of the defective row of memory cells to a bank of non-volatile storage elements (e.g., a fuse or anti-fuse bank), an access operation may be conducted on a redundant row of memory cells associated with the bank of non-volatile storage elements, instead of on the defective row. Thus, in some examples, the read operation described herein may be conducted on a redundant row of memory cells (e.g., a redundant row 325 as described with reference to FIG. 3).

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

The memory die 200 illustrates a two-dimensional (2D) array of memory cells. In some cases, the memory device may include three-dimensional (3D) arrays or memory cells. A 3D memory array may include two or more 2D memory arrays stacked on top of one another. In some cases, 2D memory arrays in a 3D memory array may be referred to as decks, levels, layers, or dies. A 3D memory array may include any quantity of stacked 2D memory arrays (e.g., two high, three high, four high, five high, six high, seven high, eight high). This may increase the number of memory cells that may be positioned on a single die or substrate as compared with a single 2D memory array, which in turn may reduce production costs or increase the performance of the memory array, or both. In some 3D memory arrays, different decks may share at least one common access line such that some decks may share at least one of a word line 210 or a digit line 215.

Figure 3:
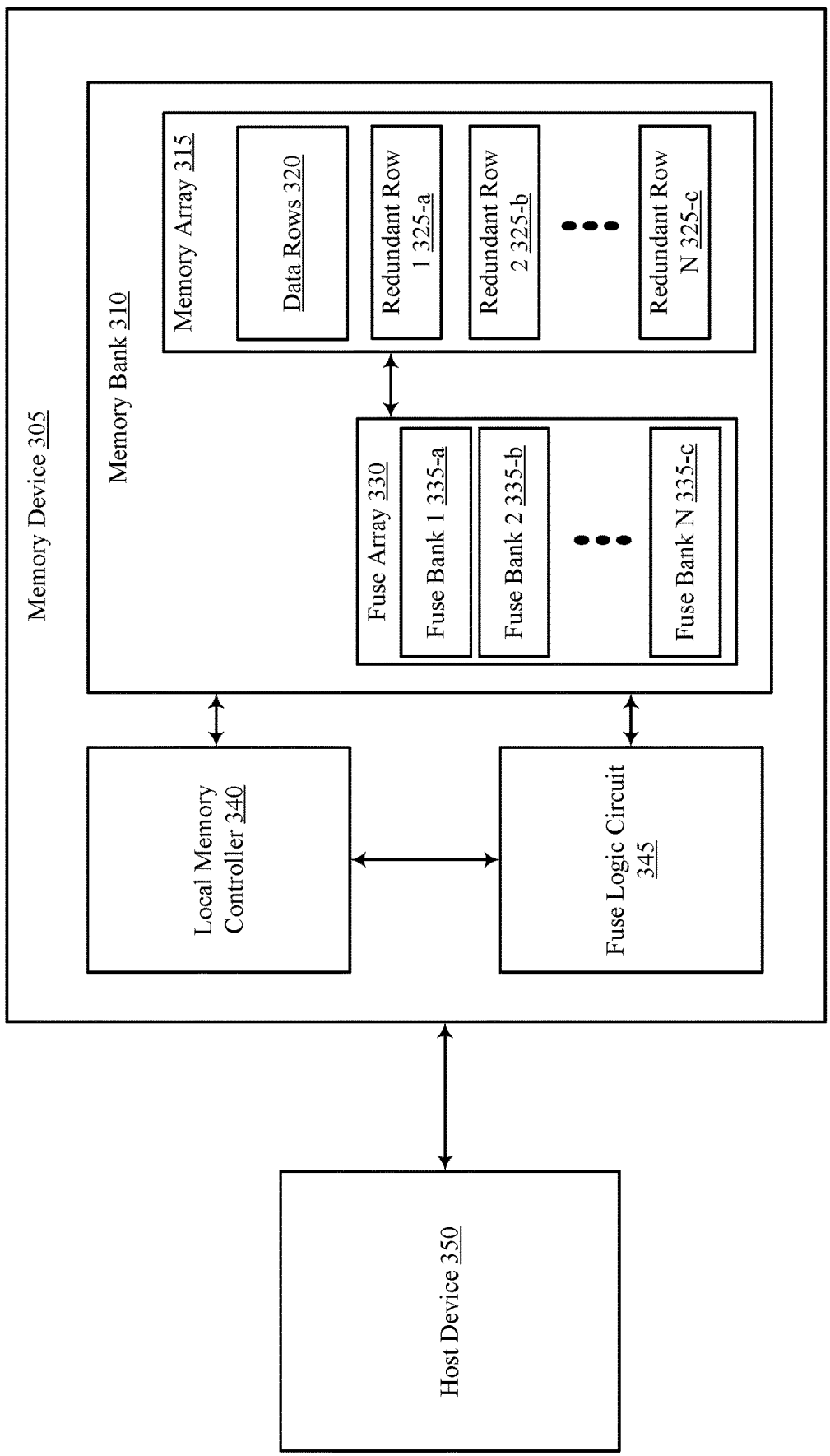
FIG. 3 illustrates an example of a system, that includes a memory device, that supports intelligent post-packaging repair in accordance with aspects of the present disclosure.

FIG. 3 illustrates an example of a system 300 in accordance with various examples of the present disclosure. The system 300 may be an example of one or more aspects of system 100 as described with reference to FIG. 1. The system 300 may include a memory device 305, which may include a memory bank 310 coupled with a local memory controller 340 and a fuse logic circuit 345. In some examples, the memory device 305 may be coupled with a host device 350. As shown in FIG. 3, memory bank 310 may include a memory array 315 and a fuse array 330. Further, wherever "fuse" is used herein, it is to be understood that an anti-fuse or other one-time programmable storage element may be used, and that in some cases a non-volatile but reprogrammable storage element may be used. In some examples, the memory array 315 may include data rows 320, which also may be referred to as prime rows or prime data rows, and redundant rows 325-a, 325-b, and 325-c. Additionally, the fuse array 330 may include fuse banks 335-a, 335-b, and 335-c, any number of which may be flexibly available for both pre-packaging repair and PPR. Though one fuse array 330 is shown for simplicity, it is to be understood that a memory device 305 may include any number of fuse arrays 330 and any number fuse banks 335, and that fuse banks 335 flexibly available for both pre-packaging repair and PPR may be distributed across any number of fuse arrays 330. Each fuse bank 335 may include any number of one or more non-volatile storage elements, which may in some cases be one-time programmable storage elements (e.g., fuses or anti-fuses). In some cases, as used herein, a fuse bank 335 may be collectively referred to as a non-volatile storage element. In some examples, the components of system 300 may operate to conduct an intelligent PPR operation as described herein.

In some examples, the memory bank 310 may include a memory array 315 that includes data rows 320 (which may also be referred to as prime rows or prime data rows) and one or more redundant rows (e.g., redundant rows 325-a, 325-b, and 325-c). In some examples, each individual data row 320 may be a row of memory cells be connected to a single word line (e.g., a word line 210 as described with reference to FIG. 2) and may include a plurality of memory cells (e.g., a plurality of memory cells 205 as described with reference to FIG. 2). Each data row 320 may be associated with a particular address (row address) for data storage. For example, each data row 320 may have been initially assigned (e.g., during production) an address to be used in an access operation (e.g., during a normal or a non-PPR operation mode). Thus data may be read from and written to each memory cell of a respective data row 320 using its particular row address.

The memory bank 310 may also include redundant rows 325-a, 325-b, and 325-c. In some examples, the memory bank 310 may include a plurality of redundant rows 325. For example, redundant row 1 325-a may represent a first redundant row, redundant row 2 325-b may represent a second redundant row, and redundant row N 325-c may represent an Nth redundant row (e.g., a 96th redundant row) of the memory array 315. Although the redundant rows 325-a, 325-b, and 325-c are illustrated as being co-located with data rows 320 (e.g., in memory array 315), in some examples one or more of the redundant rows may be physically separate from the data rows 320 (e.g., located in a separate array or on a separate substrate).

As described herein, one or more data rows 320 may become defective either before or after the memory device 305 is packaged. Accordingly, the redundant rows 325 may serve to selectively store data responsive to remapping an address associated with a defective data row 320 by storing the remapped address in a fuse bank 335 corresponding to (e.g., that maps to) a redundant row 325. For example, a first data row 320 may be identified as defective and its address may be remapped (e.g., using fuse logic circuit 345 and fuse array 330) to redundant row 2 325-b such that the data formerly associated with the defective data row 320 may be stored to and accessed (e.g., read from or written to) via redundant row 2 325-b. Stated another way, a redundant row 325 may be used to repair (i.e., "replace") a data row 320 in the event that the data row 320 becomes defective. A data row 320 may become defective before or after the memory device 305 is packaged, and each of the redundant rows 325 of the memory array 315 may be flexibly configured so as to be available for use in either a pre-packaging repair operation or a PPR operation. Meaning that, whether before or after packaging of the memory device 305, of one or more data rows 320 becomes defective, the address corresponding to the defective data row 320 may be remapped such that a redundant row 325 may be utilized as a replacement. By making the same set of redundant rows 325 available for either pre-packaging or PPR, redundant rows 325 that go unused during pre-packaging repair may remain available for PPR, and thus the memory device 305 may more efficiently support an increased number of PPR operations (e.g., without necessarily including an increased overall number of redundant rows or consuming a greater amount of power).

In some examples, the memory bank 310 may include a fuse array 330, which may include a plurality of banks 335 of non-volatile storage elements (e.g., fuses or anti-fuses). Each fuse bank 335 of the fuse array 330 may include one or more non-volatile storage elements. Each non-volatile storage element may in some cases be a one-time programmable storage element.

As shown in FIG. 3, the fuse array 330 may include fuse banks 335-a, 335-b, and 335-c. In some examples, the fuse array 330 may include a plurality of fuse banks. For example, fuse bank 1 335-a may represent a first fuse bank, fuse bank 2 325-b may represent a second fuse bank, and fuse bank N 325-c may represent an Nth fuse bank (e.g., a 96th fuse bank) of the memory bank 310. Although the fuse banks 335-a, 335-b, and 335-c are illustrated as being located within memory bank 310 and coupled with memory array 315, in some examples the fuse banks 335 may be physically separate from the memory bank 310 and may be in indirect communication with the memory array 315 via one or more components (e.g., local memory controller 340).

In some examples the fuse array 330 may be coupled with the memory array 315 such that a fuse banks 335 (e.g., fuse bank 1 335-a, fuse bank 2 335-b, and fuse bank N 335-c) may map an address associated with a defective data row 320. Stated another way, one or more of data rows 320 may become defective, and one or more redundant rows 325 (e.g., redundant row 325-a) may be used to repair (i.e., "replace") the defective data rows 320, where the fuse banks 335 may map addresses associated with the defective data rows 320 to corresponding redundant rows 325.

In some cases, because an individual fuse bank 335 may map the address associated with a defective data row 320 to a corresponding redundant row 325, a 1:1 relationship between fuse banks 335 flexibly available for pre-packaging repair or PPR and redundant rows may exist. A fuse search operation may occur to identify one or more fuse banks 335 that remain available for use in a PPR operation. Accordingly, when an individual data row 320 becomes defective, a fuse bank 335 identified as available may store the address of the defective data row 320, which may result in a corresponding redundant row 325 being accessed in a subsequent access operation (e.g., as opposed to the defective data row 320). In some examples, the fuse search operation may identify a total number of fuse banks 335 available for use in a PPR operation (e.g., some number of the N fuse banks 335 are available).

In some examples, each non-volatile storage element in a fuse bank 335 may be either a fuse or an anti-fuse. Both a fuse and an anti-fuse may be a one-time programmable device—meaning that each fuse bank 335 may be capable of storing a defective row address one time. A fuse may store a bit based on whether an electrically conductive path through the fuse has been broken (e.g., due to a current passing through the fuse exceeding a predefined level). Conversely, for example, an anti-fuse may store a bit based on whether an electrically conductive path has been formed through the anti-fuse (e.g., due to a voltage across through the anti-fuse exceeding a predefined level). Whether the non-volatile storage element comprises a fuse or an anti-fuse or some other type of non-volatile memory (one-time programmable or otherwise), a set or row of non-volatile storage elements, such as a fuse bank 335, may be configured to store the row address associated with the defective data row 320, which may allow for a corresponding redundant row 325 to be accessed during a subsequent access operation.

In some examples, the local memory controller 340 may communicate with the memory bank 310 to facilitate a PPR operation. For example, the local memory controller 340 may receive a row address that corresponds to a defective data row 320. In some examples, the row address may be received from the host device 350, meaning that the host device 350 may determine that a data row is defective, or from another controller internal to the memory device 305 (e.g., a device memory controller 155), where the host device 350 or the other internal controller may have determined that the data row 320 is defective. In other examples, the local memory controller 340 may determine, independent from the host device 350, that the data row 320 is defective. In some examples, the local memory controller 340 may then determine an address (e.g., a row address) associated with the defective data row 320.

After receiving the defective row address, the local memory controller 340 may determine whether a fuse bank 335 (e.g., of the fuse array 330) is available to store the received row address. In some examples, this determination may be made based on one or more signals received from the fuse logic circuit 345. For example, the fuse logic circuit 345 may determine that fuse bank 1 335-a is available and communicate its availability to the local memory controller 340.

In some examples, the local memory controller 340 may then store the received row address (of the defective data row 320) in the fuse bank 335 (e.g., fuse bank 1 335-a) based at least in part on determining that the fuse bank 335 is available. By storing the received row address in the fuse bank 335, the corresponding redundant row 325 (e.g., redundant row 1 325-a) may be used to repair (i.e., "replace") the defective data row 320. In a subsequent access operation (e.g., a read operation or a write operation), the received row address stored in the fuse bank 335 may indicate that the redundant row 325 (e.g., redundant row 1 325-a) associated with the fuse bank 335 (e.g., fuse bank 335-a) is to be accessed instead of the defective data row 320.

Additionally or alternatively, the local memory controller 340 may determine whether the received row address has been previously stored at any fuse bank 335 (e.g., at fuse bank 2 335-b) of the memory device 305. The local memory controller 340 may be configured to disable any fuse bank 335 identified as already storing the received row address. Stated another way, a data row 320 may have been previously determined to be defective and its associated row address may have been stored to a fuse bank 335 of the fuse array 330. The corresponding redundant row 325 may have then "replaced" the defective row 320. However, in some examples, the corresponding redundant row 325 that "replaced" the defective row 320 may, too, have since become defective. Thus, in some examples, the local memory controller 340 may determine that the redundant row 325 (e.g., the redundant row 325 that "replaced" the defective row 320) has itself become defective, disable the associated fuse bank 335, and store the associated address to a new, unused fuse bank 335. Thus a new, unused redundant row 325 may "replace" the previously-used redundant row 325 that became defective.

As described herein, the fuse logic circuit 345 may communicate with the memory bank 310 and the local memory controller 340 in a PPR operation. In some examples, the fuse logic circuit 345 may include one or more components (e.g., logic gates or other components) configured to facilitate a PPR operation. In order to conduct a PPR operation, the fuse logic circuit 345 may communicate directly with the memory bank 310. In other examples, the fuse logic circuit 345 may communicate with both the memory bank 310 and local memory controller 340 in order to conduct one or more aspects of the operation. For example, the fuse logic circuit 345 may aid in a determination of whether a particular fuse bank 335 is available or whether an address associated with a defective data row 320 of memory cells has already been stored to a fuse bank 335. In some examples, any one or more of the functions ascribed herein to the fuse logic circuit 345 may be performed by the local memory controller 340.

Is some examples, the fuse logic circuit 345 may conduct a fuse search and/or a fuse broadcast operation. A fuse search operation may, for example, comprise scanning fuse banks 335 to determine or identify one or more fuse banks 335 that remain available for a PPR operation. The fuse search operation may scan any number of fuse banks 335 in searching for an available fuse bank 335. A fuse search operation is discussed in greater detail below with reference to FIGS. 5A and 5B. Additionally or alternatively, a fuse broadcast operation may comprise scanning fuse banks 335 to read the contents of each fuse bank 335 (e.g., for transferring the contents to mode registers or other storage within the memory device 305). A fuse broadcast operation may be conducted, for example, to identify row addresses (for data rows 320) that have been stored to fuse banks 335 so as to map to the redundant rows associated with those fuse banks 335 rather than the defective data rows 320 during subsequent access operations. A fuse broadcast operation is discussed in greater detail below with reference to FIGS. 5A and 5B.

Additionally or alternatively, the fuse logic circuit 345 may determine whether a fuse bank 335 is available using one or more digital logic devices. For example, the fuse logic circuit 345 may include an availability component (e.g., availability component 505 as described with reference to FIG. 5) that is configured to determine which fuse banks 335 are available, if any. In some examples, the fuse logic circuit 345 may also include a storage component (not shown) that is configured to store (e.g., map) an address of a defective data row 320 to an available fuse bank. These components, and the functions of the fuse logic circuit 345, are discussed in greater detail below with reference to FIG. 5.

As described herein, a host device 350 may be coupled with the memory device 305. In some examples, the host device 350 may communicate directly with the local memory controller 340 and/or the fuse logic circuit 345. The host device 350 may indicate to the memory device 305, for example, that a PPR operation is to commence. In some examples, the host device 350 may transmit a PPR command, an activation command, and/or a defective row address to the memory device. For example, the memory device 305 may be operating in an idle or operational mode, and the host device 350 may transmit, to the memory device, a command to enter PPR mode based on a determination that a row of memory cells (e.g., of data rows 320) is defective. As described herein, this determination may be made by either the host device 350 or the local memory controller 340.

In some examples, after transmitting the command to enter PPR mode, the host device 350 may transmit an activate command to the memory device 305. An activate command may include or be transmitted concurrently or otherwise in association with an address of a defective data row 320. In some examples, the activate command may also initiate a fuse search and/or a fuse broadcast operation. In some examples, the local memory controller 340 and/or fuse logic circuit 345 may also determine whether the received row address has been previously stored to a fuse bank 335. If the received row address has been previously stored, however, the fuse bank 335 that was previously configured to store the received row address may be disabled, and the received row address may be stored to a new, available fuse bank 335. In either example, after the address has been stored to an available fuse bank 335, the PPR operation may end, and any subsequent access operations associated with the address may utilize the redundant row 325 (e.g., instead of the defective prime row 320) corresponding to the newly utilized fuse bank 335.

Figure 4:
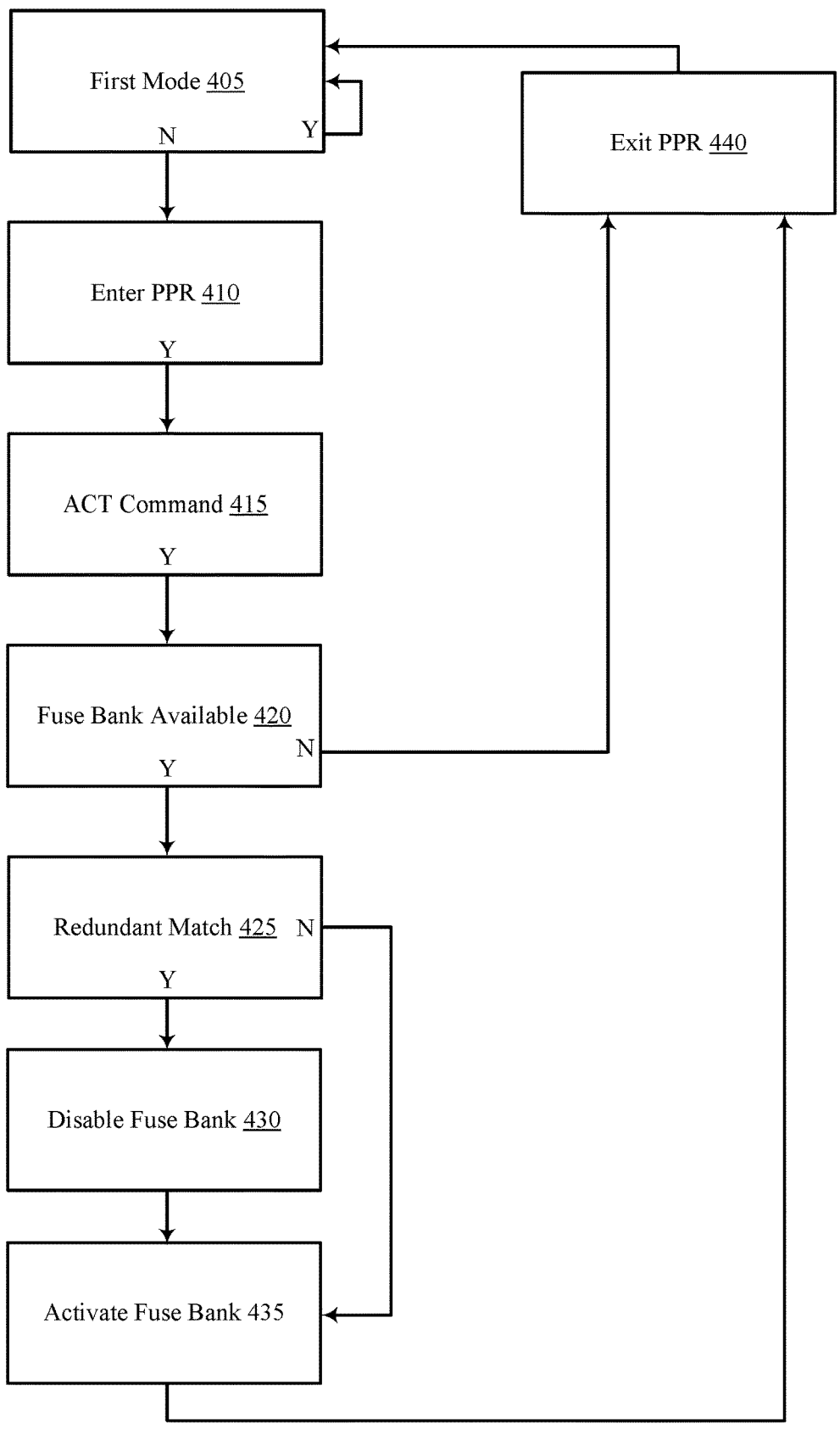
FIG. 4 illustrates an example of a process flow diagram that illustrates an exemplary intelligent post-packaging repair operation in accordance with aspects of the present disclosure.

FIG. 4 illustrates an process flow diagram 400 that illustrates an exemplary intelligent post-packaging repair operation in accordance with aspects of the present disclosure. In some examples, the process flow diagram 400 may illustrate one or more operations conducted by a fuse logic circuit (e.g., a fuse logic circuit 345 as described with reference to FIG. 3). The process flow diagram 400 may illustrate an first mode 405, an enter PPR command 410, an activation command 415 (e.g., an ACT command), a fuse bank available operation 420, a redundant match operation 425, a disable fuse bank operation 430, an activate fuse bank operation 435, and an exit PPR operation 440.

In some examples, a memory device (e.g., a memory device 305 as described with reference to FIG. 3) may be operating in a first mode. The first mode may be an idle mode, an ordinary operating mode of a memory array, or any other non-PPR mode. For example, one or more access operations (e.g., a read operation) may occur when the memory device is in the first mode. The memory device may be in the first mode for any duration until the memory device enters PPR mode.

As described herein, a memory device may receive a command to enter PPR mode based on a determination that a row of memory cells (e.g., a data row 320 as described with reference to FIG. 3) is defective. Thus, the Enter PPR command 410 may represent a memory device entering PPR mode based on a determination (e.g., by a host device 350 as described with reference to FIG. 3) that a row of memory cells is defective. As described herein, the memory device may exit first mode 405 and enter a PPR mode based on the determination that the row of memory cells is defective. In some examples, upon entering PPR mode, the memory device may receive an activate or ACT command 415. In some examples, the ACT command 415 may be received from a host device (e.g., a host device 350 as described with reference to FIG. 3) or a local memory controller (e.g., a local memory controller 340 as described with reference to FIG. 3) and may indicate or be received in association with (e.g., concurrently with) a defective row address. In some cases, a single command, or any other number of commands (e.g., as part of a command sequence), may comprise an Enter PPR command 410 and an ACT command 415.

Upon receiving an ACT command 415, the memory device may begin a fuse bank available operation 420, which may include or be included in a fuse search operation. In some examples, a fuse bank available operation 420 may determine the availability of one or more fuse banks 335 for a PPR operation. For example, during the fuse bank available operation 420, a fuse logic circuit and/or local memory controller may determine that a particular fuse bank 335 is available to store an address corresponding to a defective data row 320. The determination may be made, for example, based on a value of one or more bits stored by the fuse bank 335. The fuse bank available operation 420 may be performed until a fuse bank 335 is determined to be available, or until the number of available fuse banks 335 is determined, or until it is determined that no fuse banks 335 are available. In some examples, a memory device may not have any available fuse banks 335, which may result in the PPR operation ending (e.g., an Exit PPR operation 440).

In some examples, the memory device may perform a redundant match operation 425, which may include or be included in a fuse search operation. In some cases, a redundant match operation 425 may occur in parallel (e.g., wholly or partially concurrent with) a fuse bank available operation 420. As described herein, a redundant match operation 425 may determine whether a received defective row address (e.g., as part of or in association with the ACT command 415) has already (previously) been stored to a fuse bank 335. For example, a PPR operation may have previously stored an address associated with a defective data row 320 to a particular fuse bank 335. In the instance that match is detected between the received (defective) row address and a row address stored by a fuse bank 335, the fuse bank 335 that stores (because it was previously configured to store) the received (defective) row address may be disabled (e.g., at disable fuse bank operation 430). In some examples, such a fuse bank 335 may be disabled by disabling (e.g., "blowing") one or more fuses in the fuse bank 335.

After conducting at least the redundant match operation 425, an activate fuse bank operation 435 may be performed. In some examples, the activate fuse bank operation 435 may include storing an address associated with a defective data row 320 to an available fuse bank 335. After storing the address associated with the defective data row 320 to the available fuse bank 335, the PPR operation may cease (e.g., Exit PPR operation 440). In some cases, the memory device may then re-enter first mode 405 or any other operational mode until, upon receiving a subsequent Enter PPR command 410, a subsequent PPR operation may commence.

Figure 5:
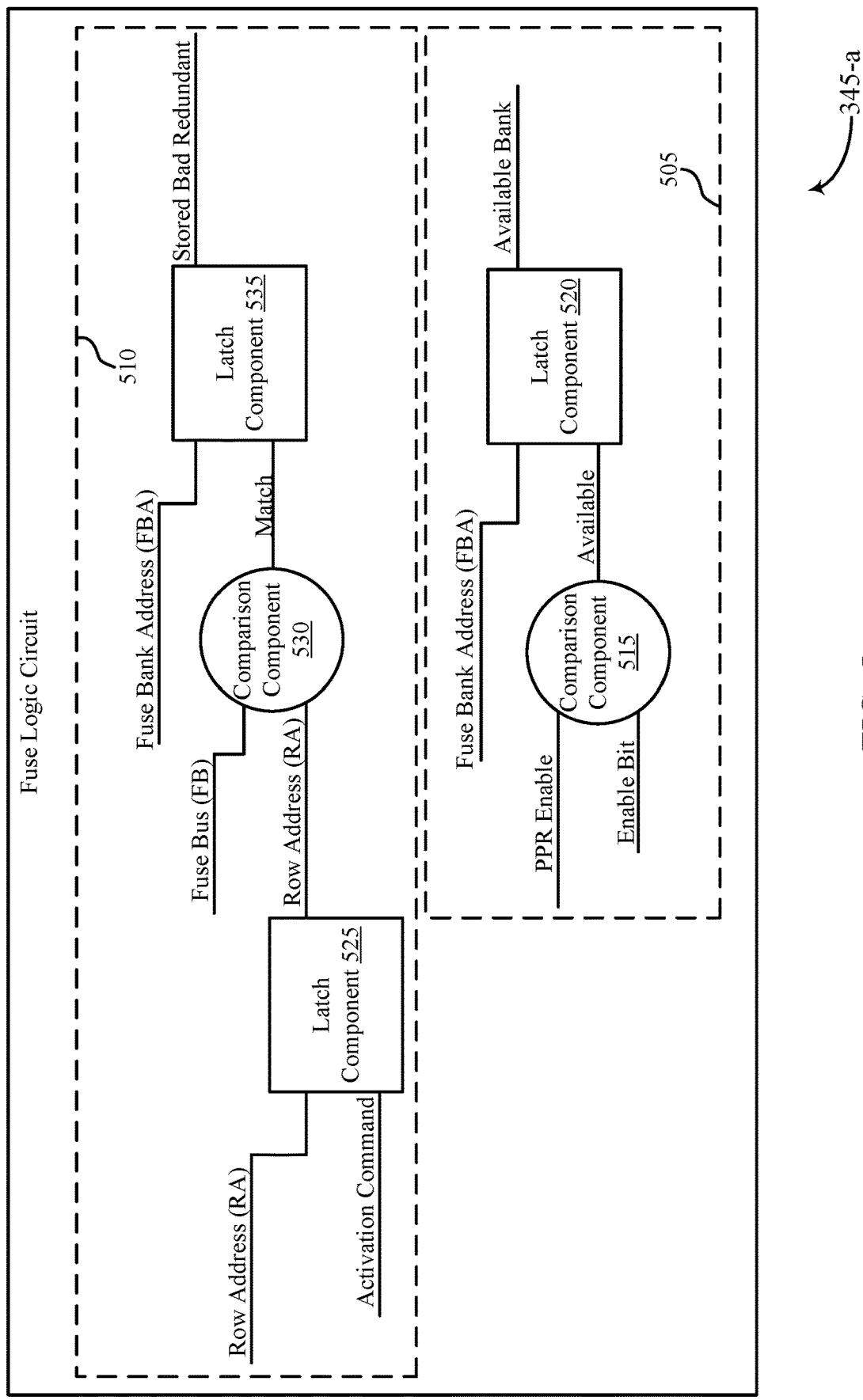
FIG. 5 illustrates an example of a fuse logic circuit that supports intelligent post-packaging repair in accordance with aspects of the present disclosure.

FIG. 5 illustrates an example of a fuse logic circuit 345-a in accordance with various examples of the present disclosure. The fuse logic circuit 345-a may be an example of the fuse logic circuit 345 as described with reference to FIG. 3. The fuse logic circuit 345-a may include an availability component 505 and a disable component 510. In some examples, the availability component 505 may be configured to determine the availability of one or more fuse banks 335 as described with reference to FIG. 3 and may include a comparison component 515 and a latch component 520. Additionally or alternatively, the disable component 510 may be configured to determine whether a defective row address has been previously stored to a fuse bank 335 as described with reference to FIG. 3 and may include a latch component 525, a comparison component 530, and a latch component 535. In some examples, the components of fuse logic circuit 345-a may operate directly with a memory bank (e.g., a memory bank 310 as described with reference to FIG. 3) and/or with a local memory controller (e.g., a local memory controller 340 as described with reference to FIG. 3) to conduct an intelligent PPR operation as described herein.

As described herein, the fuse logic circuit 345-a may include an availability component 505 that is configured to determine the availability of fuse banks 335. In some examples, the availability component 505 may include a comparison component 515, which may be referred to as a first comparison component, and a latch component 520, which may be referred to as a first latch component. In some examples, the comparison component 515 may be or include one or more digital logic gates such as an XOR (e.g., an exclusive-or) gate, an AND gate, or a similar digital logic device used for comparing multiple input signals. The latch component 520 may be or include one or more digital logic devices such as a SR latch, a D latch, a T latch, a JK latch, or a similar digital logic device used for latching one or more input signals.

In order to determine the availability of one or more fuse banks 335, the comparison component 515 may be activated by a PPR Enable signal (e.g., which may be or be triggered by an ACT command 415, or an Enter PPR signal 410) and may evaluate an Enable Bit signal. In some examples, the PPR Enable signal may indicate that the device is activating in a PPR mode. The Enable Bit input signal may reflect the contents of one or more fuses in a fuse bank 335.

In some examples, the defective row address received by the comparison component 515 (shown in the context of the disable component 510 as the Row Address (RA) signal) may include n bits. Similarly, each fuse bank 335 may include n+m fuses and therefore be configured to store n bits corresponding to a row address and an additional m bits, where m may be one or more, and the additional m bits may be configured to enable or disable the fuse bank 335. For example, the RA input signal may include 13 bits and the fuse bank 335 may include 14 non-volatile storage elements, and thus be capable of storing 14 bits. In some examples, one or more of them bits stored by the fuse bank 335 may be designated as an enable bit and may be used to determine whether the fuse bank 335 is available (e.g., whether it is activated and unused). Thus, the comparison component 515 may determine whether a fuse bank 335 is available based on the status of one or more bits (e.g., one or more enable bits) stored thereby. In some cases, the comparison component 515 may determine whether a fuse bank 335 is available by comparing one or more bits stored by the fuse bank 335 to a reference value (e.g., may evaluate a fuse included in a fuse bank 335 to determine whether the bit stored by the fuse indicates that the fuse bank 335 is disabled). For example, whether the particular bit is a "1" or a "0" may indicate, to the comparison component 515, whether the fuse bank 335 is available. In some cases, the comparison component 515 may compare one bit stored by the fuse bank 335 to another bit stored by the fuse bank 335 (e.g., may XOR two bits stored by the fuse bank 335) to determine whether the fuse bank 335 is available.

As described herein, the comparison component 515 may be or include one or more digital logic devices such as an XOR gate or an AND gate. Depending on the type of digital logic device used, the comparison component 515 may indicate that a particular fuse bank 335 is available in a different manner. For example, the comparison component 515 may be an AND gate, and a "high" output signal may occur when an evaluated fuse bank 335 is available. Or, in some examples, the comparison component 515 may be an XOR gate, a "low" output signal may occur when an evaluated fuse bank 335 is available. Regardless of the type of digital logic device, the comparison component 515 may be configured to output an Available signal (e.g., a "high" signal or a "low" signal) that indicates that an evaluated fuse bank 335 is available.

When the Available signal indicates that a fuse bank 335 currently under evaluation as part of a fuse search procedure is available, this may cause (trigger) latch component 520 to latch the address of the fuse bank 335 currently under evaluation as. As the comparison component 515 evaluates one or more enable bits of each scanned fuse bank 335, a corresponding Fuse Bank Address (FBA) input signal may be provided to the latch component 520, which may at any time comprise the address of the fuse bank 335 whose enable bits are being evaluated by the comparison component 515. Accordingly, when comparison component 515 outputs an Available signal, the FBA signal—and thus the address of the corresponding fuse bank 335—may be latched. The latch component 520 may then output an Available Bank signal, which may comprise or otherwise indicate the address of the fuse bank 335 determined to be available to store the received row address (that is, available to store the address of the defective data row 320).

As described herein, the fuse logic circuit 345-a may also include a disable component 510 that is configured to determine whether a defective row address has been previously stored to a fuse bank 335 as described with reference to FIG. 3. In some examples the disable component 510 may include a comparison component 530, which may be referred to as a second comparison component, and a latch component 535, which may be referred to as a second latch component. In some examples, the disable component may also include a latch component 525, which may be referred to as a third latch component. Comparison component 530 may be or may include one or more digital logic devices such as an XOR (e.g., an exclusive-or) gate, an AND gate, or a similar digital logic device used for comparing multiple input signals. Additionally or alternatively, the latch component 525 and/or the latch component 535 may be or may include one or more digital logic devices such as a SR latch, a D latch, a T latch, a JK latch, or a similar digital logic device used for latching one or more input signals.

In some examples, the disable component 510 may determine whether a defective row address has been previously stored to a fuse bank 335 based on the latch component 525 receiving the RA input signal and an Activation Command input signal. As explained above, the RA input signal may include a defective row address (e.g., a row address of a defective data row 320 as described with reference to FIG. 3). In some examples, the Activation Command input signal may be received from a host device (e.g., a host device 350 as described with reference to FIG. 3) or a local memory controller (e.g., a local memory controller 340 as described with reference to FIG. 3). In some cases, one or both of the RA signal and the Activation Command input signal may be received over one or more CA channels 186 as described with reference to FIG. 1. The Activation Command input signal may indicate, to the disable component 510, that a PPR operation is to be initiated. The latch component 525 may then latch each of the RA input signal based on the Activation Command input signal, and output the latched RA signal—that is, the latch component may output the row address of the defective data row 320 that is to be repaired (replaced) via PPR.

The RA signal output from the latch component 525 may be provided as one input to the comparison component 530.

In some examples, the comparison component 530 may receive a second input, which may be a Fuse Bus (FB) input signal. The FB input signal may be or include, for example, the n bits stored by a fuse bank 335 currently under evaluation as part of a fuse search procedure. Stated another way, the comparison component 530 may compare the RA input signal with addresses stored by fuse banks 335—that is, addresses of previously-repaired data rows 320—to determine whether a match exists. As described herein, the comparison component 530 may be or include one or more digital logic devices such as an XOR gate or an AND gate. Depending on the type of digital logic device used, the comparison component 530 may indicate that the RA signal matches the FB signal in a different manner. For example, the comparison component 530 may be an AND gate, and a "high" output signal may indicate that a match exists. Or, in some examples, the comparison component 530 may be an XOR gate, and a "low" output signal may indicate that a match exists. Regardless of the type of digital logic device, the comparison component 530 is configured to output a signal (e.g., a "high" signal or a "low" signal) that indicates whether a match exists between the RA input signal and the FB input signal.

In some examples, the Match signal output from the comparison component 530 may be provided as an input (e.g., a clocking or triggering input) to latch component 535. In some examples, a Fuse Bank Address (FBA) input signal provided to the latch component 535 as a second input. In some examples, the FBA input signal is associated with an address of the fuse bank whose contents were read to generate the concurrent FB signal. Stated another way, as the comparison component 530 is comparing the RA input signal with the FB input signal, a corresponding FBA input signal is being provided to the latch component 535, where the FBA signal comprises the address of the fuse bank 335 evaluated to generate the FB signal. Accordingly, when comparison component 530 outputs a Match signal, the FBA input signal may be latched by the latch component 535. The latch component 535 may then output a Stored Bad Redundant signal, which indicates the address of a fuse bank 335 previously used to store the defective row address—that is, the address of the fuse bank 335 that is to be disabled because the corresponding redundant row 325 has now itself become defective, after previously having been used to repair (replace) the data row 320 having the row address indicated by the RA signal.

Although discussed as independent operations, in some examples one or more aspects of the operations performed by the availability component 505 and the disable component 510 may occur concurrently. For example, the availability component 505 may determine whether a particular fuse bank 335 is available at a same time that the disable component 510 determines whether the row address to be repaired has been previously stored to the particular fuse bank 335—that is, a fuse bank 335 may be concurrently evaluated both with respect to its availability and with respect to whether it should be disabled. In other examples, one or more aspects the operations performed by the availability component 505 and the disable component 510 may be performed serially.

The operations performed by the availability component 505 and/or the disable component 510 may facilitate a defective address being stored to an available, unused fuse bank 335. For example, the Available Bank signal may be provided to a storage component (not shown) of the fuse logic circuit 345-a. The storage component may be configured to store (e.g., map) the defective row address to the fuse bank 335 based on the operations of the availability component 505. The Stored Bad Redundant signal may be provided to a deactivate component (not shown) of the fuse logic circuit 345-a. If a fuse bank 335 is flagged for disabling (has an address that matches that latched by latch component 535), the memory device may disable the flagged fuse bank 335 by changing a value of one or more enable bits stored by the flagged fuse bank 335 (e.g., by blowing one or more fuses or anti-fuses to change the value of the m bits stored by the corresponding m fuses or anti-fuses included in the flagged fuse bank 335). In some examples, a local memory controller (e.g., a local memory controller 340 as described with reference to FIG. 3) may conduct or control another component to conduct one or more of the operations of a storage component or deactivate component as discussed herein. Meaning, for example, that a local memory controller may be coupled with the fuse logic circuit 345-a and be configured to store the defective row address to an available and unused fuse bank 335.

Figure 6:
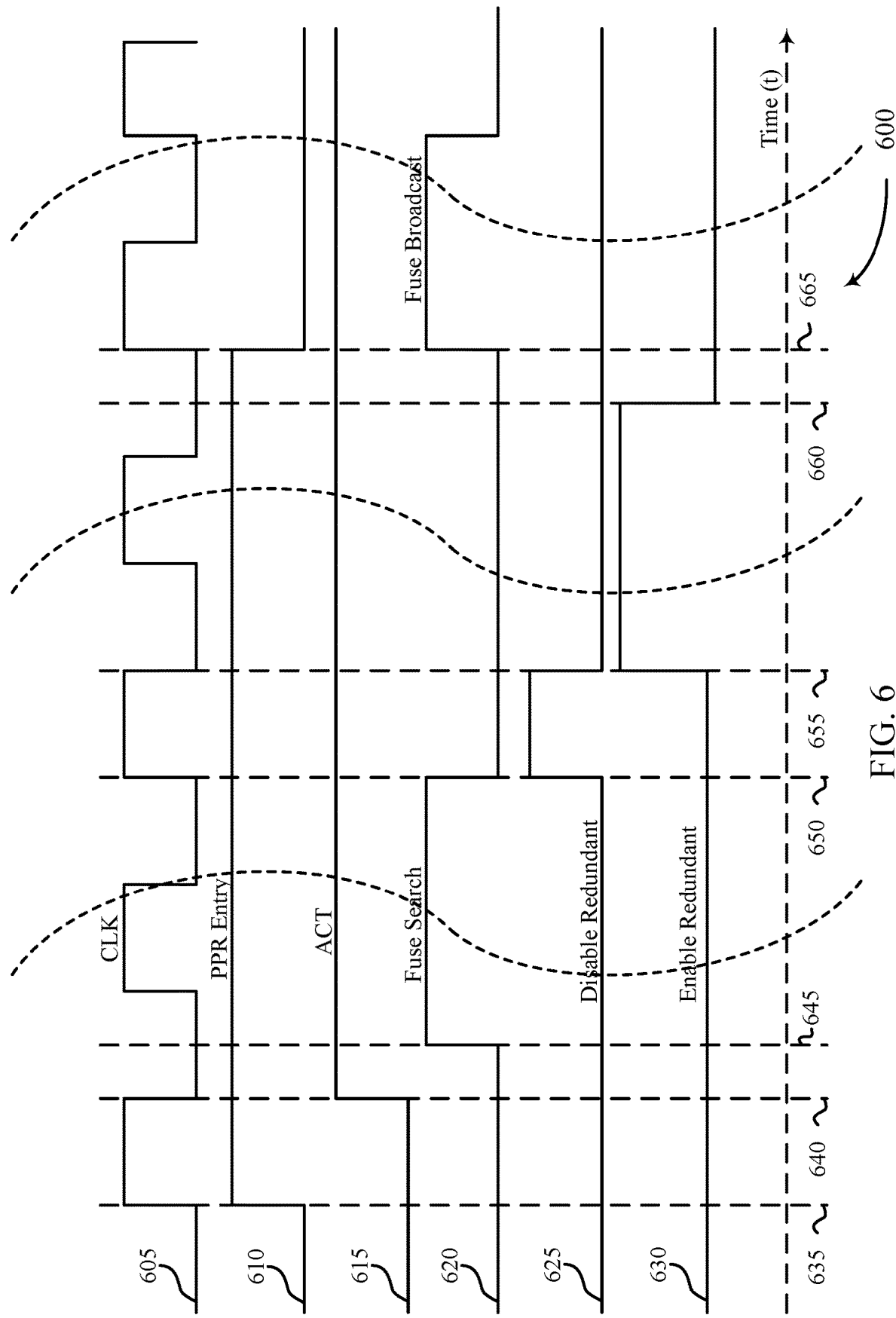
FIG. 6 illustrates a timing diagram that supports intelligent post-packaging repair in accordance with aspects of the present disclosure.

FIG. 6 illustrates a timing diagram 600 in accordance with various examples of the present disclosure. The timing diagram 600 may illustrate one or more operations related to an intelligent PPR operation as described herein. For example, the timing diagram 600 may illustrate a clock (e.g., CLK) signal 605, a PPR entry signal 610, an activation (e.g., ACT) signal 615, a fuse search signal 620, a disable redundant signal 625, and an enable redundant signal 630. In some examples, the fuse search signal 620 may be associated with a fuse search and a fuse broadcast operation.

As described herein, a local memory controller (e.g., local memory controller 340 as described with reference to FIG. 3) may include a system clock that generates a common (source) system clock signal, which may be represented by CLK signal 605. At 635, a PPR Entry signal may be provided to a memory device (e.g., a memory device 305 as described with reference to FIG. 3). The PPR Entry signal 610 may be indicated by the PPR Entry signal 610 going "high." In some examples, the PPR Entry signal may convey, to the memory device, that a defective row exists, and that an operation to repair the defective row (e.g., a PPR operation) is commencing. As described herein, the PPR Entry signal 610 may be provided to the memory device, for example, by a host device (e.g., a host device 350 as described with reference to FIG. 3).

At time 640, an ACT command 615 may be received by the memory device. In some examples, the ACT command 615 may be indicated by the ACT command signal 615 going "high." The ACT command 615 may be received from a host device or a local memory controller (e.g., a local memory controller 340 as described with reference to FIG. 3). A row address for a row to be repaired may be received whole the ACT command signal 615 is high may indicate, to one or more components of the memory device, a defective row address to be stored to a fuse bank 335 during a PPR operation.

At time 645, a fuse search signal 620 may be received by the memory device. In some examples, the fuse search signal 620 may represent a fuse search operation commencing, which may be indicated by the fuse search signal 620 going "high." During a fuse search operation, for example, a fuse bank available operation 420 may be conducted to determine whether any fuse banks 335 are available for use in a PPR operation and, if so, identify the address of one or more available fuse banks 335. For example, a memory device may include multiple fuse banks 335 that each include one or more non-volatile storage elements. Not every fuse bank 335 may be available for a PPR operation (e.g., one or more fuse banks 335 may already have been used or designated for a different operation). In some cases, during a fuse search operation, for example, a disable fuse bank operation 430 may be conducted to determine whether any fuse banks 335 should be disabled based on their associated redundant row 325 having become defective, as indicated by the fuse bank 335 storing the address of the row to be repaired. As indicated by the curved, dashed line shown in FIG. 6, a fuse search operation may occur for a greater or lesser number of clock cycles (e.g., CLK signal 605) than depicted (e.g., for n clock cycles).

At 650 the fuse search operation may end, and a disable redundant operation may commence. In some examples, the disable redundant operation may disable a fuse bank 335 whose associated redundant row 325 has become defective, as determined during the fuse search operation (e.g., during a disable fuse bank operation 430). The commencement of this operation may, in some examples, be indicated by the disable redundant signal 625 going "high." In some examples, disabling a fuse bank 335 may include blowing at least one fuse of the fuse bank 335 one bit of the row address. The duration of the disable redundant signal 625 being "high" (e.g., between 650 and 655) may be representative of a single fuse of a fuse bank 335 being blown.

At 655 the disable redundant operation may end, and an enable redundant signal 630 may be received by the memory device. In some examples, the enable redundant signal 630 may represent an operation to store the received defective row address at a fuse bank 335 determined to be available during a fuse search operation (e.g., during a fuse bank available operation 420). The commencement of this operation may, in some examples, be indicated by the enable redundant signal 630 going "high." During the operation conducted at 655, one or more fuses of the fuse bank 335 may be blown to configure the fuse bank 335 to store the defective row address. In some examples, this may be referred to as enabling the fuse bank 335. The duration of the enable redundant signal 630 being "high" (e.g., between 655 and 660) may be representative of one or more bits (e.g., up to n bits) of a fuse bank 335 being blown. Thus, in some examples, as shown in FIG. 6, an enable redundant operation may occur for a greater number of clock cycles than a disable redundant operation. As indicated by the curved, dashed line shown in FIG. 6, an enable redundant operation may occur for a greater or lesser number of clock cycles (e.g., CLK signal 605) than depicted (e.g., for n clock cycles).

At 665 the PPR operation may end, and the fuse search signal 620 may again go active (e.g., high). In some examples, the fuse search signal 620 again going active (e.g., high) may represent a fuse broadcast operation commencing. A fuse broadcast operation may be conducted, for example, to read out row addresses that have been stored to fuse banks 335 (e.g., to transfer row addresses that have been stored to fuse banks 335 to mode registers or other storage utilized during operation of a memory device). For example, after a PPR operation occurs, the memory device may return to ordinary operations. Meaning that access operations may occur on one or more memory cells of a memory array (e.g., memory array 315 as described with reference to FIG. 3). Because one or more memory cells of the memory array may have become defective, and subsequently repaired using a redundant row during a PPR operation, a fuse broadcast operation may inform the memory device of any repairs. For example, during a fuse broadcast operation, the contents of each fuse bank may be read and provided to a memory controller of the memory device (e.g., to a local memory controller 340 as described with reference to FIG. 3), such that the local memory controller is informed as to which addresses have been repaired. In some examples, as shown in FIG. 6, a fuse broadcast operation may occur for a greater or lesser number of clock cycles (e.g., CLK signal 605) than depicted (e.g., for n clock cycles).

Figure 7:
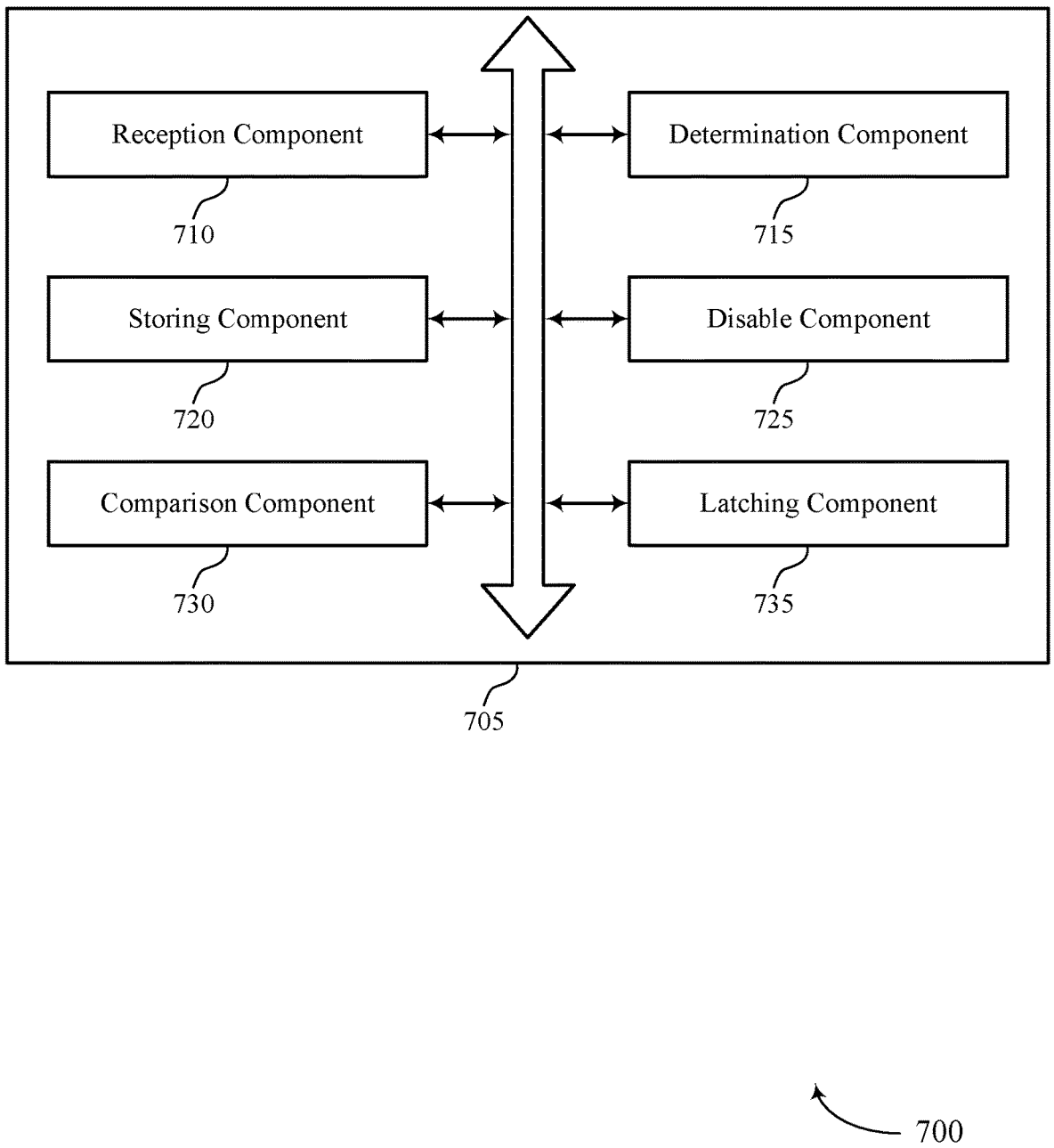
FIG. 7 illustrates a block diagram of a device that supports intelligent post-packaging repair in accordance with aspects of the present disclosure.

FIG. 7 shows a block diagram 700 of a local memory controller 705 that supports intelligent post-packaging repair in accordance with aspects of the present disclosure. The local memory controller 705 may be an example of aspects of a memory controller (e.g., device memory controller 155 as described with reference to FIG. 1) The local memory controller 705 may include reception component 710, determination component 715, storing component 720, disable component 725, comparison component 730, and latching component 735. Each of these components may communicate, directly or indirectly, with one another (e.g., via one or more buses).

Reception component 710 may receive a row address that corresponds to a defective row within a memory array of a memory device. In some examples, reception component 710 may receive a post-packing repair (PPR) command from the host device. In some examples, reception component 710 may receive a second row address corresponding to a second defective row within the memory array of the memory device.

Determination component 715 may determine that a non-volatile storage element of a plurality of non-volatile storage elements (e.g., a bank of a plurality of banks) of the memory device is available to store the received row address based at least in part on receiving the row address. In some examples, each non-volatile storage element of the plurality of non-volatile storage elements (e.g., each bank of the plurality of banks) supports storing a row address of the memory array. In some examples, determination component 715 may determine that the received row address has been stored at a second non-volatile storage element (e.g., second bank) of the memory device. In some examples, determination component 715 may determine that the stored row address matches the received row address.

In some examples, determination component 715 may determine that the received row address corresponds to the defective row based at least in part on receiving the PPR command from the host device. In some examples, determination component 715 may determine that each of the plurality of non-volatile storage elements (e.g., each of the plurality of banks) of the memory device are unavailable based at least in part on the received second row address.

Storing component 720 may store the received row address in the non-volatile storage element (e.g., bank) based at least in part on determining that the non-volatile storage element (e.g., bank) is available to store the received row address.

Disable component 725 may disable the second non-volatile storage element (e.g., second bank) based at least in part on determining that the received row address has been stored at the second non-volatile storage element (e.g., second bank).

Comparison component 730 may compare a row address stored at the second non-volatile storage element (e.g., second bank) with the received row address.

Latching component 735 may latch an address of the second non-volatile storage element (e.g., second bank) based at least in part on determining that the stored row address matches the received row address. In some examples, latching component 735 may latch the address of the non-volatile storage element (e.g., address of the bank) after comparing the at least one bit associated with the address of the non-volatile storage element (e.g., address of the bank) with the at least one bit associated with the received row address.

Figure 8:
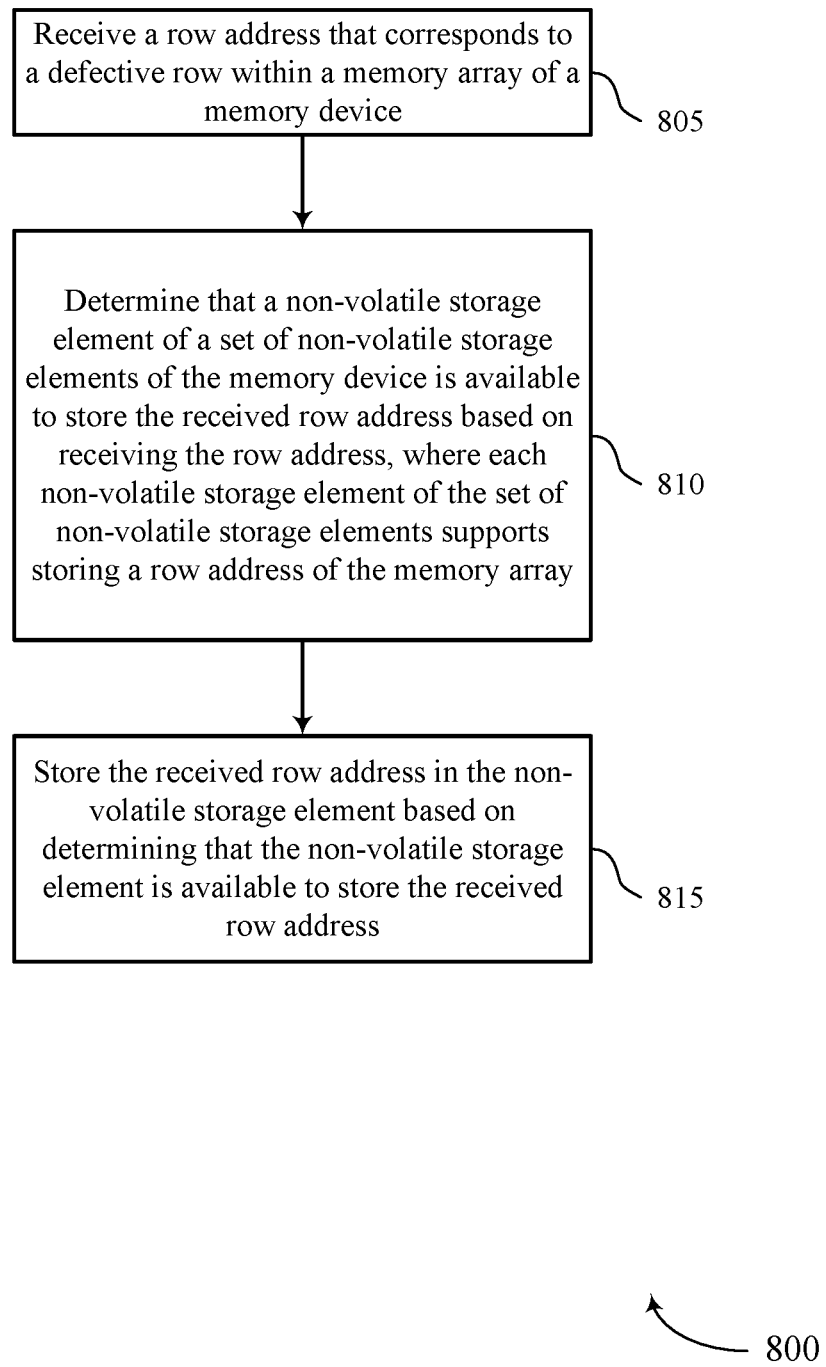
FIGS. 8 through 10 show flowcharts illustrating methods that support intelligent post-packaging repair in accordance with aspects of the present disclosure.

FIG. 8 shows a flowchart illustrating a method 800 that supports intelligent post-packaging repair in accordance with aspects of the present disclosure. The operations of method 800 may be implemented by a local memory controller or its components as described herein. For example, the operations of method 800 may be performed by one or more components of a local memory controller as described with reference to FIG. 7. In some examples, a local memory controller may execute a set of instructions to control the functional elements of the local memory controller to perform the functions described below. Additionally or alternatively, a local memory controller may perform aspects of the functions described below using special-purpose hardware.

At 805, a row address may be received that corresponds to a defective row within a memory array of a memory device. The operations of 805 may be performed according to the methods described herein. In some examples, aspects of the operations of 805 may be performed by a reception component as described with reference to FIG. 7.

At 810, a determination that a non-volatile storage element of a set of non-volatile storage elements (e.g., bank of a set of banks) of the memory device is available to store the received row address based on receiving the row address may be made. In some examples, each non-volatile storage element of the set of non-volatile storage elements (e.g., each bank of the set of banks) may support storing a row address of the memory array. The operations of 810 may be performed according to the methods described herein. In some examples, aspects of the operations of 810 may be performed by a determination component as described with reference to FIG. 7.

At 815, the received row address may be stored in the non-volatile storage element (e.g., bank) based on determining that the non-volatile storage element (e.g., bank) is available to store the received row address. The operations of 815 may be performed according to the methods described herein. In some examples, aspects of the operations of 815 may be performed by a storing component as described with reference to FIG. 7.

In some examples, an apparatus as described herein may perform a method or methods, such as method 800. The apparatus may include features, means, or instructions (e.g., a non-transitory computer-readable medium storing instructions executable by a processor) for receiving a row address that corresponds to a defective row within a memory array of a memory device, determining that a non-volatile storage element of a plurality of non-volatile storage elements (e.g., bank of a set of banks) of the memory device is available to store the received row address based at least in part on receiving the row address, wherein each non-volatile storage element of the plurality of non-volatile storage elements (e.g., bank of the set of banks) supports storing a row address of the memory array, and storing the received row address in the non-volatile storage element (e.g., bank) based at least in part on determining that the non-volatile storage element (e.g., bank) is available to store the received row address.

Some examples of the methods, apparatuses, and non-transitory computer-readable medium described herein may further include operations, features, means, or instructions for determining that the received row address has been stored at a second non-volatile storage element (e.g., second bank) of the memory device and disabling the second non-volatile storage element (e.g., second bank) based at least in part on determining that the received row address has been stored at the second non-volatile storage element (e.g., second bank).

In some examples of the methods, apparatuses, and non-transitory computer-readable medium described herein, determining that the received row address has been stored at the second non-volatile storage element (e.g., second bank) may include comparing a row address stored at the second non-volatile storage element (e.g., second bank) with the received row address, determining that the stored row address matches the received row address, and latching an address of the second non-volatile storage element (e.g., address of the second bank) based at least in part on determining that the stored row address matches the received row address.

In some examples of the methods, apparatuses, and non-transitory computer-readable medium described herein, determining that the non-volatile storage element (e.g., bank) is available occurs concurrently with determining that the received row address has been stored at the second non-volatile storage element (e.g., second bank).

In some examples of the methods, apparatuses, and non-transitory computer-readable medium described herein, the received row address is received from a host device coupled with the memory device.

Some examples of the methods, apparatuses, and non-transitory computer-readable medium described herein may further include operations, features, means, or instructions for receiving a post-packing repair (PPR) command from the host device and determining that the received row address corresponds to the defective row based at least in part on receiving the PPR command from the host device.

Some examples of the methods, apparatuses, and non-transitory computer-readable medium described herein may further include operations, features, means, or instructions for receiving a second row address corresponding to a second defective row within the memory array of the memory device and determining that each of the plurality of non-volatile storage elements (e.g., each bank of the plurality of banks) of the memory device are unavailable based at least in part on the received second row address.

In some examples of the methods, apparatuses, and non-transitory computer-readable medium described herein, determining that the non-volatile storage element (e.g., bank) is available comprises at least a first bit stored by the non-volatile storage element (e.g., bank) with at least a second bit stored by the non-volatile storage element (e.g., bank).

Some examples of the methods, apparatuses, and non-transitory computer-readable medium described herein may further include operations, features, means, or instructions for latching the address of the non-volatile storage element (e.g., address of the bank) after comparing at least the first bit stored by the non-volatile storage element (e.g., bank) with at least the second bit stored by the non-volatile storage element (e.g., bank).

In some examples of the methods, apparatuses, and non-transitory computer-readable medium described herein, the non-volatile storage element comprises a bank of fuses or a bank of anti-fuses.

In some examples of the methods, apparatuses, and non-transitory computer-readable medium described herein, storing the received row address in the non-volatile storage element (e.g., bank) comprises blowing a fuse or blowing an anti-fuse.

In some examples of the methods, apparatuses, and non-transitory computer-readable medium described herein, the non-volatile storage element (e.g., bank) is available for pre-packaging repair and post-packaging repair.

Figure 9:
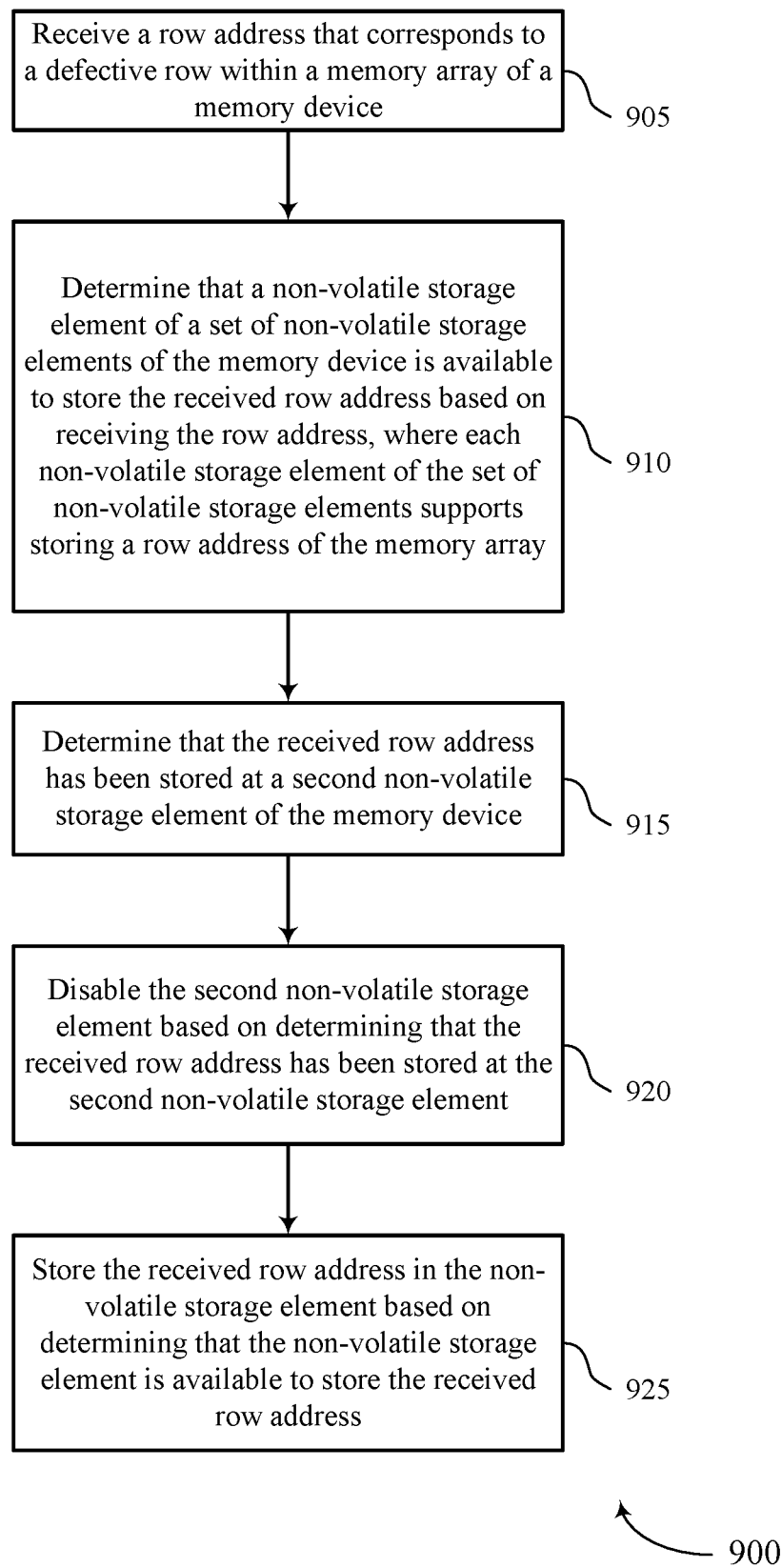

FIG. 9 shows a flowchart illustrating a method 900 that supports intelligent post-packaging repair in accordance with aspects of the present disclosure. The operations of method 900 may be performed by one or more components of a local memory controller as described with reference to FIG. 7. In some examples, a local memory controller may execute a set of instructions to control the functional elements of the local memory controller to perform the functions described below. Additionally or alternatively, a local memory controller may perform aspects of the functions described below using special-purpose hardware.

At 905, a row address that corresponds to a defective row within a memory array of a memory device may be received. The operations of 905 may be performed according to the methods described herein. In some examples, aspects of the operations of 905 may be performed by a reception component as described with reference to FIG. 7.

At 910, a determination that a non-volatile storage element of a set of non-volatile storage elements (e.g., bank of a set of banks) of the memory device is available to store the received row address based on receiving the row address may be made. In some examples, each non-volatile storage element of the set of non-volatile storage elements (e.g., each bank of the set of banks) may support storing a row address of the memory array. The operations of 910 may be performed according to the methods described herein. In some examples, aspects of the operations of 910 may be performed by a determination component as described with reference to FIG. 7.

At 915, a determination that the received row address has been stored at a second non-volatile storage element (e.g., second bank) of the memory device may be made. The operations of 915 may be performed according to the methods described herein. In some examples, aspects of the operations of 915 may be performed by a determination component as described with reference to FIG. 7.

At 920, the second non-volatile storage element (e.g., second bank) may be disabled based on determining that the received row address has been stored at the second non-volatile storage element (e.g., second bank). The operations of 920 may be performed according to the methods described herein. In some examples, aspects of the operations of 920 may be performed by a disable component as described with reference to FIG. 7.

At 925, the received row address may be stored in the non-volatile storage element (e.g., bank) based on determining that the non-volatile storage element (e.g., bank) is available to store the received row address. The operations of 925 may be performed according to the methods described herein. In some examples, aspects of the operations of 925 may be performed by a storing component as described with reference to FIG. 7.

Figure 10:
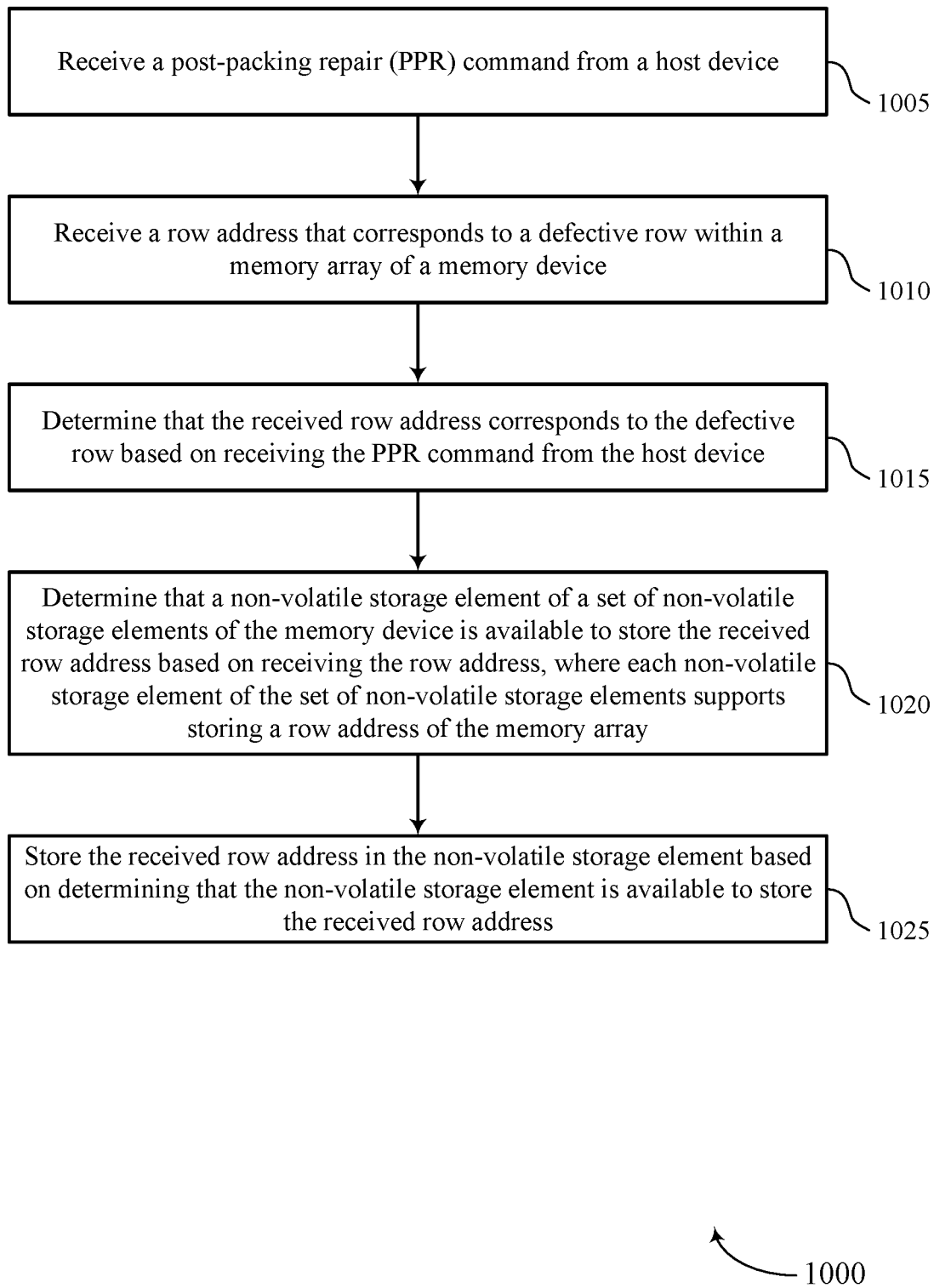

FIG. 10 shows a flowchart illustrating a method 1000 that supports intelligent post-packaging repair in accordance with aspects of the present disclosure. The operations of method 1000 may be performed by one or more components of a local memory controller as described with reference to FIG. 7. In some examples, a local memory controller may execute a set of instructions to control the functional elements of the local memory controller to perform the functions described below. Additionally or alternatively, a local memory controller may perform aspects of the functions described below using special-purpose hardware.

At 1005, a post-packing repair (PPR) command may be received from a host device. The operations of 1005 may be performed according to the methods described herein. In some examples, aspects of the operations of 1005 may be performed by a reception component as described with reference to FIG. 7.

At 1010, a row address that corresponds to a defective row within a memory array of a memory device may be received. The operations of 1010 may be performed according to the methods described herein. In some examples, aspects of the operations of 1010 may be performed by a reception component as described with reference to FIG. 7.

At 1015, a determination that the received row address corresponds to the defective row based may be made based on receiving the PPR command from the host device. The operations of 1015 may be performed according to the methods described herein. In some examples, aspects of the operations of 1015 may be performed by a determination component as described with reference to FIG. 7.

At 1020, a determination that a non-volatile storage element of a set of non-volatile storage elements (e.g., bank of a set of banks) of the memory device is available to store the received row address may be made based on receiving the row address. In some examples, each non-volatile storage element of the set of non-volatile storage elements (e.g., each bank of the set of banks) may support storing a row address of the memory array. The operations of 1020 may be performed according to the methods described herein. In some examples, aspects of the operations of 1020 may be performed by a determination component as described with reference to FIG. 7.

At 1025, the received row address may be stored in the non-volatile storage element based on determining that the non-volatile storage element (e.g., bank) is available to store the received row address. The operations of 1025 may be performed according to the methods described herein. In some examples, aspects of the operations of 1025 may be performed by a storing component as described with reference to FIG. 7.

It should be noted that the methods described above describe possible implementations, and that the operations and the steps may be rearranged or otherwise modified and that other implementations are possible. Furthermore, aspects from two or more of the methods may be combined.

In some examples, an apparatus or device may perform aspects of the functions described herein. The device may include an availability component coupled with a memory array of a memory device and configured to determine an availability of a non-volatile storage element of a plurality of non-volatile storage elements (e.g., bank of a plurality of banks) of the memory device based at least in part on receiving a row address for a defective row of the memory array and a storage component configured to map the row address to the non-volatile storage element (e.g., bank) based at least in part on the availability of the non-volatile storage element (e.g., bank).

In some examples, the availability component may include a first comparison component configured to compare at least a first bit stored by the non-volatile storage element (e.g., bank) with at least a second bit stored by the non-volatile storage element (e.g., bank), and a first latch coupled with the first comparison component, the first latch configured to latch the address of the non-volatile storage element (e.g., address of the bank) based at least in part on the first comparison component comparing at least the first bit stored by the non-volatile storage element (e.g., bank) with at least the second bit stored by the non-volatile storage element (e.g., bank).

In some examples, the device may include a disable component coupled with the memory array of the memory device and configured to determine whether the row address has been previously stored within the plurality of non-volatile storage elements (e.g., within the banks).

In some examples, the availability component is configured to determine the availability of the non-volatile storage element (e.g. bank) while the disable component determines whether the row address has been previously stored within the non-volatile storage elements (e.g., within the banks).

In some examples, the disable component may include a second comparison component configured to compare the row address for the defective row with a row address stored to a second non-volatile storage element of the plurality of non-volatile storage elements (e.g., second bank of the plurality of banks) and a second latch coupled with the second comparison component, the second latch configured to latch an address of the second non-volatile storage element (e.g., address of the second bank) based at least in part on the second comparison component comparing the row address for the defective row with the row address stored to the second non-volatile storage element (e.g., address stored to the second bank).

In some examples, the device may include a third latch coupled with the second comparison component, the third latch configured to latch the row address for the defective row, wherein the second comparison component is configured to compare the row address for the defective row with the row address stored to the second non-volatile storage element (e.g., address stored to the second bank) based at least in part on the third latch latching the row address for the defective row.

In some examples, the device may include a host device coupled with the memory device, the host device configured to transmit the row address for the defective row to the memory device, wherein the availability component is configured to determine the availability of the non-volatile storage element (e.g., bank) of the memory device based at least in part on receiving the row address for the defective row from the host device.

In some examples, the memory device comprises a plurality of non-volatile storage elements, and each non-volatile storage element of the plurality comprises a bank of fuses or anti-fuses.

In some examples, an apparatus or device may perform aspects of the functions described herein. The device may include a memory array comprising a plurality of memory cells, a plurality of non-volatile storage elements (e.g., banks) coupled with the memory array, and a memory controller coupled with the memory array and the plurality of non-volatile storage elements (e.g., banks). In some examples, the memory controller may be operable to receive a row address that corresponds to a defective row, determine that a non-volatile storage element of the plurality of non-volatile storage elements (e.g., bank of the plurality of banks) of the memory device is available to store the received row address based at least in part on receiving the row address, and store the received row address in the non-volatile storage element (e.g., bank) based at least in part on determining that the non-volatile storage element (e.g., bank) is available.

In some examples, the memory controller may be operable to cause the device to determine that the received row address has been stored at a second non-volatile storage element (e.g., second bank) of the memory device and disable the second non-volatile storage element (e.g., second bank) of the memory device based at least in part on determining that the received row address has been stored at the second non-volatile storage element (e.g., second bank).

In some examples, the memory controller may be operable to cause the device to store the received row address in the non-volatile storage element (e.g., bank) and disable the second non-volatile storage element (e.g., second bank) simultaneously.

In some examples, storing the received row address in the non-volatile storage element (e.g., bank) comprises mapping the received row address to be repaired to the non-volatile storage element (e.g., bank).

In some examples, the plurality of non-volatile storage elements (e.g., plurality of banks) each comprise at least one fuse or at least one anti-fuse, and wherein storing the received row address in the non-volatile storage element (e.g., bank) comprises blowing the at least one fuse or blowing the at least one anti-fuse.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    receiving a row address that corresponds to a row within a memory array of a memory device;
    determining, based at least in part on receiving the row address, that the row address has been stored to a first non-volatile storage element of the memory device that is associated with a first redundant row within the memory array used to replace the row based at least in part on the first non-volatile storage element storing the row address, wherein the memory device comprises a plurality of non-volatile storage elements configured to store row addresses of the memory array;
    disabling the first non-volatile storage element of the memory device based at least in part on determining that the row address has been stored to the first non-volatile storage element of the memory device, wherein receiving the row address stored to the first non-volatile storage element indicates that the first redundant row has become defective; and
    storing the row address to a second non-volatile storage element of the memory device based at least in part on disabling the first non-volatile storage element of the memory device, wherein the second non-volatile storage element is associated with a second redundant row within the memory array used to replace the first redundant row based at least in part on the second non-volatile storage element storing the row address.

2. The method of claim 1, further comprising:
    determining that the first redundant row associated with the first non-volatile storage element is defective based at least in part on receiving the row address that corresponds to the row within the memory array of the memory device; and
    determining that the second non-volatile storage element of the plurality of non-volatile storage elements of the memory device is available to store the row address.

3. The method of claim 2, wherein determining that the second non-volatile storage element is available comprises:
    comparing at least one bit stored by the second non-volatile storage element to a reference value that indicates that the second non-volatile storage element is available to store the row address.

4. The method of claim 1, further comprising:
    receiving, for a second time, the row address that corresponds to the row within the memory array of the memory device; and
    accessing the second redundant row within the memory array of the memory device associated with the second non-volatile storage element based at least in part on receiving the row address for the second time.

5. The method of claim 1, further comprising:
    reading a plurality of row addresses that have been stored to respective non-volatile storage elements of the memory device before receiving the row address, wherein determining that the row address has been stored to the first non-volatile storage element of the memory device is based at least in part on reading the plurality of row addresses.

6. The method of claim 1, wherein determining that the row address has been stored to the first non-volatile storage element comprises:
    comparing the row address stored in the first non-volatile storage element with the row address; and
    determining that the row address stored in the first non-volatile storage element matches the row address.

7. The method of claim 1, further comprising:
    receiving a second row address that corresponds to a defective row within the memory array of the memory device;
    determining that a third non-volatile storage element of the plurality of non-volatile storage elements of the memory device is available to store the second row address; and
    storing the second row address to the third non-volatile storage element.

8. The method of claim 7, wherein a third redundant row within the memory array of the memory device is accessible based at least in part on storing the second row address to the third non-volatile storage element.

9. An apparatus, comprising:
a comparison component coupled with a memory array of a memory device and configured to determine that a received row address is stored to a first non-volatile storage element of a plurality of non-volatile storage elements of the memory device, wherein the received row address corresponds to a defective row within the memory array of the memory device, and wherein the first non-volatile storage element is associated with a first redundant row within the memory array used to replace the defective row based at least in part on the first non-volatile storage element storing the received row address;
a storage component coupled with the comparison component and configured to store the received row address to a second non-volatile storage element of the plurality of non-volatile storage elements of the memory device based at least in part on the received row address having been stored to the first non-volatile storage element, wherein reception of the received row address stored to the first non-volatile storage element indicates that the first redundant row has become defective, and wherein the second non-volatile storage element is associated with a second redundant row within the memory array used to replace the first redundant row based at least in part on the second non-volatile storage element storing the received row address; and
a controller configured to access the second redundant row based on the storage component storing the received row address to the second non-volatile storage element.

10. The apparatus of claim 9, wherein the comparison component is configured to output a signal indicating a match between the row address stored to the first non-volatile storage element and the received row address, wherein the storage component is configured to store the received row address to the second non-volatile storage element based at least in part on the comparison component outputting the signal.

11. The apparatus of claim 9, further comprising:
an availability component configured to determine that the second non-volatile storage element is available to store the received row address based at least in part on the comparison component determining that the received row address is stored to the first non-volatile storage element.

12. The apparatus of claim 11, wherein the comparison component is configured to determine that the first redundant row associated with the first non-volatile storage element is defective, and wherein the storage component is configured to store, to the second non-volatile storage element, a mapping between the received row address and the second redundant row based at least in part on the first redundant row being defective.

13. The apparatus of claim 12, further comprising:
a disabling component configured to disable the first non-volatile storage element based at least in part on the comparison component determining that the received row address is stored to the first non-volatile storage element.

14. An apparatus, comprising:
a memory array comprising a plurality of memory cells;
a plurality of non-volatile storage elements coupled with the memory array; and
a controller coupled with the memory array and the plurality of non-volatile storage elements, the controller operable to:
receive a row address that corresponds to a row within the memory array;
determine, based at least in part on receiving the row address, that the row address has been stored to a first non-volatile storage element of the plurality of non-volatile storage elements, wherein the first non-volatile storage element is associated with a first redundant row within the memory array used to replace the row based at least in part on the first non-volatile storage element storing the row address;
disable the first non-volatile storage element based at least in part on determining that the row address has been stored to the first non-volatile storage element wherein receiving the row address stored to the first non-volatile storage element indicates that the first redundant row has become defective; and
store the row address to a second non-volatile storage element of based at least in part on disabling the first non-volatile storage element, wherein the second non-volatile storage element is associated with a second redundant row within the memory array used to replace the first redundant row based at least in part on the second non-volatile storage element storing the row address.

15. The apparatus of claim 14, wherein the controller is operable to:
determine that the first redundant row associated with the row address is defective based at least in part on receiving the row address that corresponds to the row within the memory array; and
determine that the second non-volatile storage element of the plurality of non-volatile storage elements is available to store the row address.

16. The apparatus of claim 15, wherein determining that the second non-volatile storage element is available comprises:
comparing at least one bit stored by the second non-volatile storage element to a reference value that indicates that the second non-volatile storage element is available to store the row address.

17. The apparatus of claim 14, wherein the controller is operable to:
receive, for a second time, the row address that corresponds to the row within the memory array; and
access the second redundant row within the memory array based at least in part on receiving the row address for the second time.

18. The apparatus of claim 14, wherein the controller is operable to:
read a plurality of row addresses that have been stored to respective non-volatile storage elements of the apparatus before receiving the row address, wherein determining that the row address has been stored to the first non-volatile storage element of the apparatus is based at least in part on reading the plurality of row addresses.

19. The apparatus of claim 14, wherein determining that the row address has been stored to the first non-volatile storage element comprises:
comparing the row address stored in the first non-volatile storage element with the row address; and
determining that the row address stored in the first non-volatile storage element matches the row address.

20. The apparatus of claim 14, wherein the controller is operable to:
receive a second row address that corresponds to a defective row within the memory array;

determine that a third non-volatile storage element of the plurality of non-volatile storage elements is available to store the second row address; and store the second row address to the third non-volatile storage element, wherein a third redundant row within the memory array is accessible based at least in part on storing the second row address to the third non-volatile storage element.

\* \* \* \* \*